(12) United States Patent
Lee et al.

(10) Patent No.: US 11,887,841 B2
(45) Date of Patent: Jan. 30, 2024

(54) SEMICONDUCTOR PACKAGES

(71) Applicant: Samsung Electronics Co., Ltd., Suwon-si (KR)

(72) Inventors: Kyuha Lee, Seongnam-si (KR); Joohee Jang, Hwaseong-si (KR); Seokho Kim, Hwaseong-si (KR); Hoonjoo Na, Seoul (KR); Jaehyung Park, Anyang-si (KR); Seongmin Son, Hwaseong-si (KR); Yikoan Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 144 days.

(21) Appl. No.: 17/194,575

(22) Filed: Mar. 8, 2021

(65) Prior Publication Data
US 2022/0013502 A1    Jan. 13, 2022

(30) Foreign Application Priority Data
Jul. 10, 2020    (KR) .......................... 10-2020-0085673

(51) Int. Cl.
*H01L 25/065* (2023.01)
*H01L 23/538* (2006.01)

(52) U.S. Cl.
CPC ...... *H01L 25/0657* (2013.01); *H01L 23/5385* (2013.01); *H01L 23/5386* (2013.01)

(58) Field of Classification Search
CPC ..... H01L 25/10–13; H01L 25/03–0756; H01L 25/043; H01L 25/0657; H01L 25/074; H01L 25/117; H01L 25/0652; H01L 25/42; H01L 25/0655; H01L 25/072; H01L 25/0753; H01L 25/115;
(Continued)

(56) References Cited

U.S. PATENT DOCUMENTS 6,171,976 B1    1/2001  Cheng
6,255,697 B1    7/2001  Yoo et al.
(Continued)

FOREIGN PATENT DOCUMENTS

KR    1020040067722 A    7/2004

*Primary Examiner* — Andres Munoz
*Assistant Examiner* — Lawrence C Tynes, Jr.
(74) *Attorney, Agent, or Firm* — Muir Patent Law, PLLC

(57) ABSTRACT

A semiconductor package includes a first semiconductor chip, a second semiconductor chip, first main connection pad structures, and first dummy connection pad structures. The first main connection pad structures are arranged at an interface between the first semiconductor chip and the second semiconductor chip and arranged to be apart from each other by a first main pitch in a first direction parallel to a top surface of the first semiconductor chip, wherein each of the first main connection pad structures includes a first connection pad electrically connected to the first semiconductor chip, and a second connection pad electrically connected to the second semiconductor chip and contacting the first connection pad. The first dummy connection pad structures are arranged at an interface between the first semiconductor chip and the second semiconductor chip, are arranged to be apart from the first main connection pad structures, and are arranged to be apart from each other by a first dummy pitch in the first direction, the first dummy pitch being greater than the first main pitch.

12 Claims, 24 Drawing Sheets

(58) Field of Classification Search
CPC ............. H01L 25/16–18; H01L 25/071; H01L 25/112; H01L 2225/10–1094; H01L 2225/03–06596; H01L 2225/06503–06596; H01L 27/0688; H01L 27/0694; H01L 27/11883–11888; H01L 27/281; H01L 27/11514; H01L 27/11551; H01L 27/11556
See application file for complete search history.

(56) References Cited

U.S. PATENT DOCUMENTS

| | | |
|---|---|---|
| 7,074,710 B2 | 7/2006 | Whitefield et al. |
| 7,332,380 B2 | 2/2008 | Matsuda |
| 7,757,195 B2 | 7/2010 | Smith et al. |
| 7,759,223 B2 | 7/2010 | Kida et al. |
| 2005/0110065 A1 | 5/2005 | Uchiyama et al. |
| 2020/0365514 A1* | 11/2020 | Yang ................. H01L 21/76802 |

* cited by examiner

US 11,887,841 B2

SEMICONDUCTOR PACKAGES

CROSS-REFERENCE TO RELATED APPLICATION

This application is based on and claims priority under 35 U.S.C. § 119 to Korean Patent Application No. 10-2020-0085673, filed on Jul. 10, 2020, in the Korean Intellectual Property Office, the disclosure of which is incorporated by reference herein in its entirety.

BACKGROUND

The inventive concept relates to a semiconductor package, and more particularly, to a semiconductor package having a stack structure of a plurality of semiconductor chips.

To improve the performance and storage capacity of a semiconductor device, a semiconductor package having a structure in which a plurality of semiconductor chips are stacked is widely used. In particular, a method of forming a stack structure of a plurality of semiconductor chips by attaching and sawing wafers through a connection pad has been proposed. However, in general, a step or a level difference of a connection pad including a metal material such as copper or the like occurs or local erosion of an insulating layer surrounding a connection pad occurs, which increases the difficulty of a bonding operation.

SUMMARY

Various aspects of the inventive concept provide a semiconductor package in which defects in a wafer-to-wafer bonding operation may be minimized by preventing local erosion of an insulating layer from occurring.

According to an aspect of the inventive concept, a semiconductor package includes a first semiconductor chip, a second semiconductor chip, first main connection pad structures, and first dummy connection pad structures. The first main connection pad structures are arranged at an interface between the first semiconductor chip and the second semiconductor chip and arranged to be apart from each other by a first main pitch in a first direction parallel to a top surface of the first semiconductor chip, wherein each of the first main connection pad structures includes a first connection pad electrically connected to the first semiconductor chip, and a second connection pad electrically connected to the second semiconductor chip and contacting the first connection pad. The first dummy connection pad structures are arranged at an interface between the first semiconductor chip and the second semiconductor chip, are arranged to be apart from the first main connection pad structures, and are arranged to be apart from each other by a first dummy pitch in the first direction, the first dummy pitch being greater than the first main pitch.

According to an aspect of the inventive concept, a semiconductor package includes a first semiconductor chip, a second semiconductor chip, main connection pad structures, first dummy connection pad structures, and second dummy connection pad structures. The main connection pad structures are arranged at an interface between the first semiconductor chip and the second semiconductor chip, wherein each of the main connection pad structures includes a first connection pad electrically connected to the first semiconductor chip, and a second connection pad electrically connected to the second semiconductor chip and contacting the first connection pad. The first dummy connection pad structures are arranged at the interface between the first semiconductor chip and the second semiconductor chip and are arranged to be apart from the main connection pad structures. The second dummy connection pad structures are arranged at the interface between the first semiconductor chip and the second semiconductor chip and are arranged to be apart from the main connection pad structures, wherein the first dummy connection pad structures are located in a first region between a second region in which the second dummy connection pad structures are located and a third region in which the main connection pad structures are located. The main connection pad structures have a first main pad density in relation to an area of the third region when viewed from the top of the first semiconductor chip, the first dummy connection pad structures have a first dummy pad density in relation to an area of the first region when viewed from the top of the first semiconductor chip, the second dummy connection pad structures have a second dummy pad density in relation to an area of the second region when viewed from the top of the first semiconductor chip, and the first dummy pad density is less than the first main pad density, and the second dummy pad density is less than the first dummy pad density.

According to an aspect of the inventive concept, a semiconductor package includes a first semiconductor chip; a second semiconductor chip; a first main connection pad structures arranged at an interface between the first semiconductor chip and the second semiconductor chip and arranged to be apart from each other by a first main pitch in a first direction parallel to a top surface of the first semiconductor chip; second main connection pad structures arranged at the interface between the first semiconductor chip and the second semiconductor chip and arranged to be apart from each other by a second main pitch in the first direction, the second main pitch being greater than the first main pitch; and first dummy connection pad structures arranged at the interface between the first semiconductor chip and the second semiconductor chip and arranged to be apart from each other by a first dummy pitch in the first direction, the first dummy pitch being greater than the first main pitch, wherein each of the first main connection pad structures and the second main connection pad structures includes a first connection pad electrically connected to the first semiconductor chip, and a second connection pad electrically connected to the second semiconductor chip and contacting the first connection pad.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail below with reference to the accompanying drawings.

Figure 1:
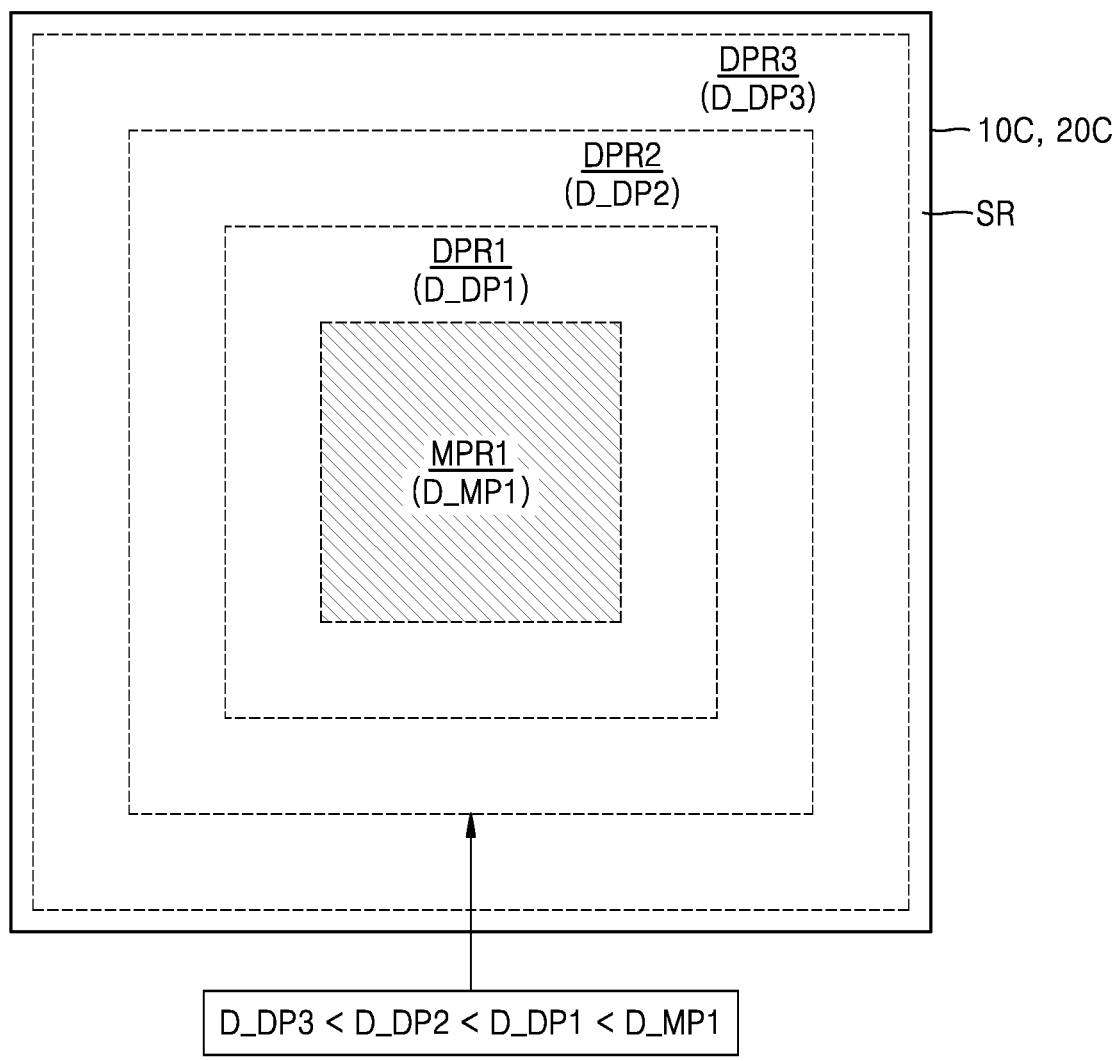
FIG. 1 is a layout diagram of a semiconductor package according to an example embodiment.
Figure 2:
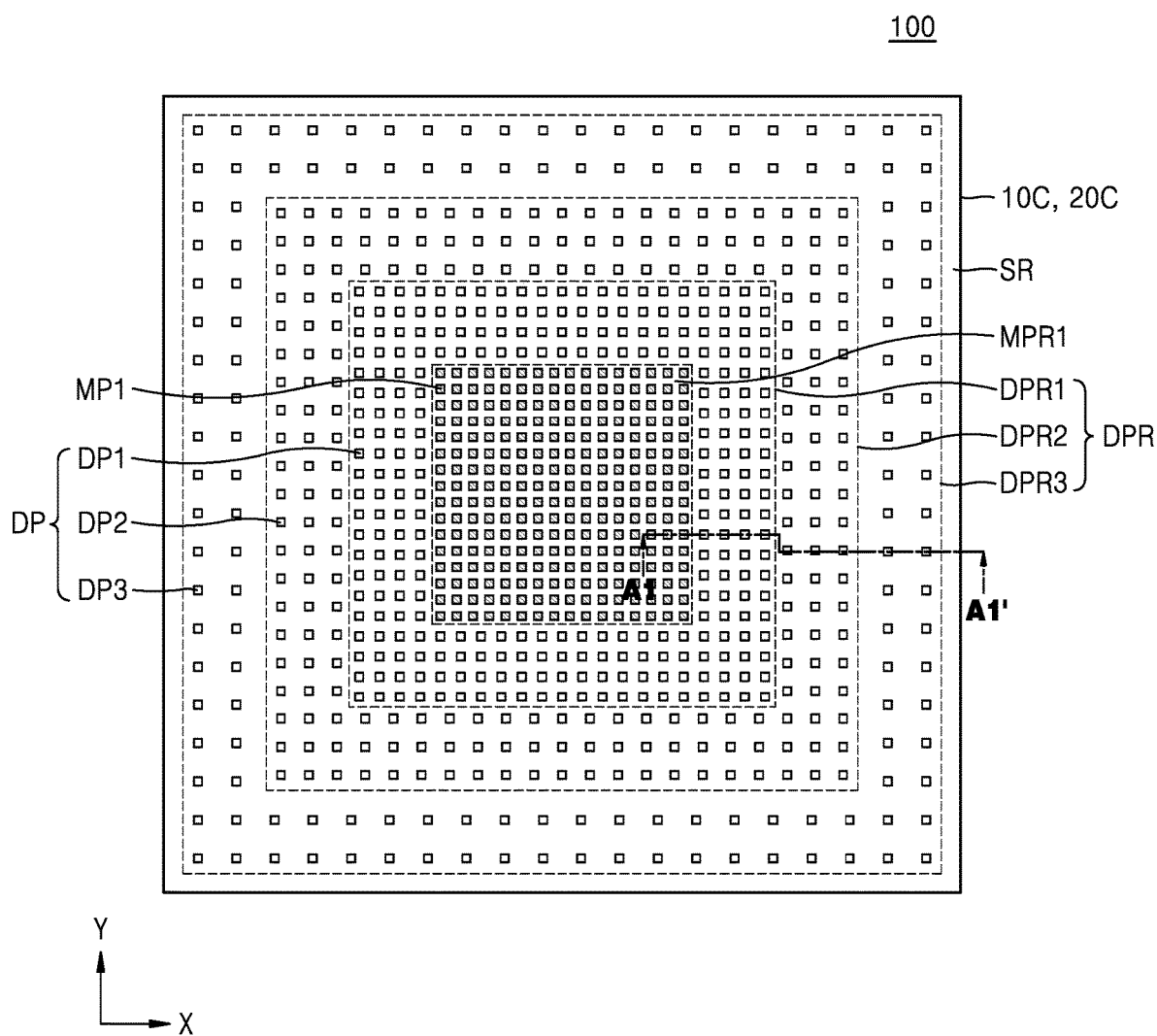
FIG. 2 is a schematic diagram illustrating an example of a pad arrangement of FIG. 1.
Figure 3:
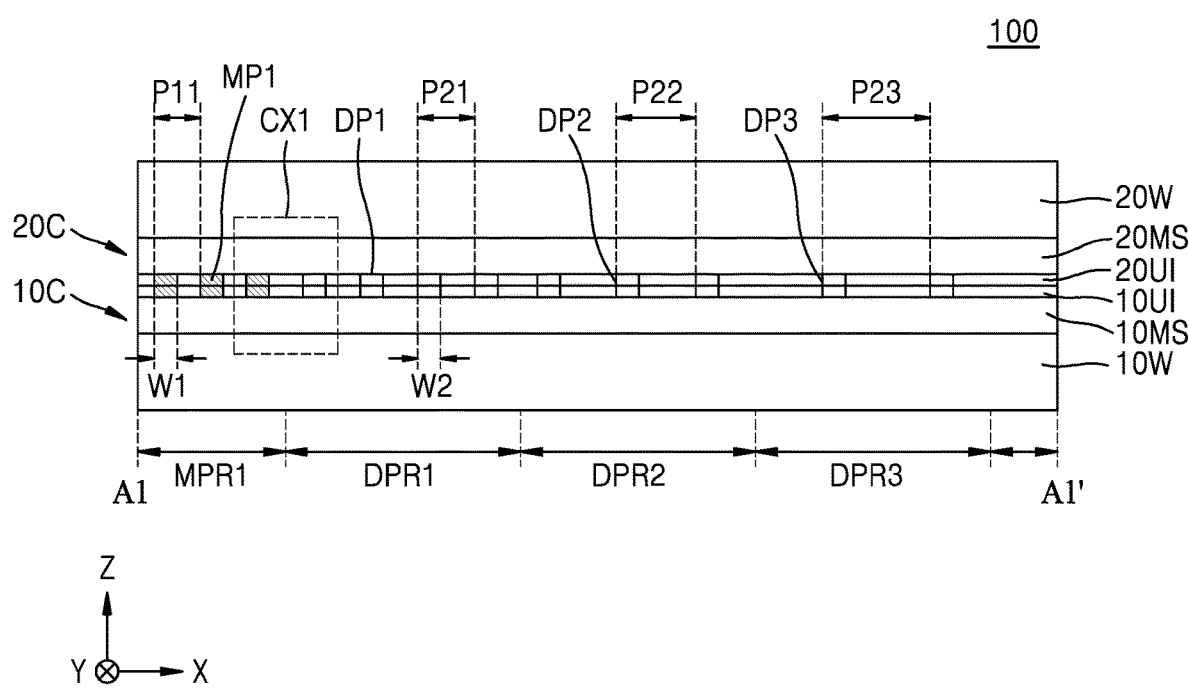
FIG. 3 is a cross-sectional view taken along line A1-A1' of FIG. 2.
Figure 4:
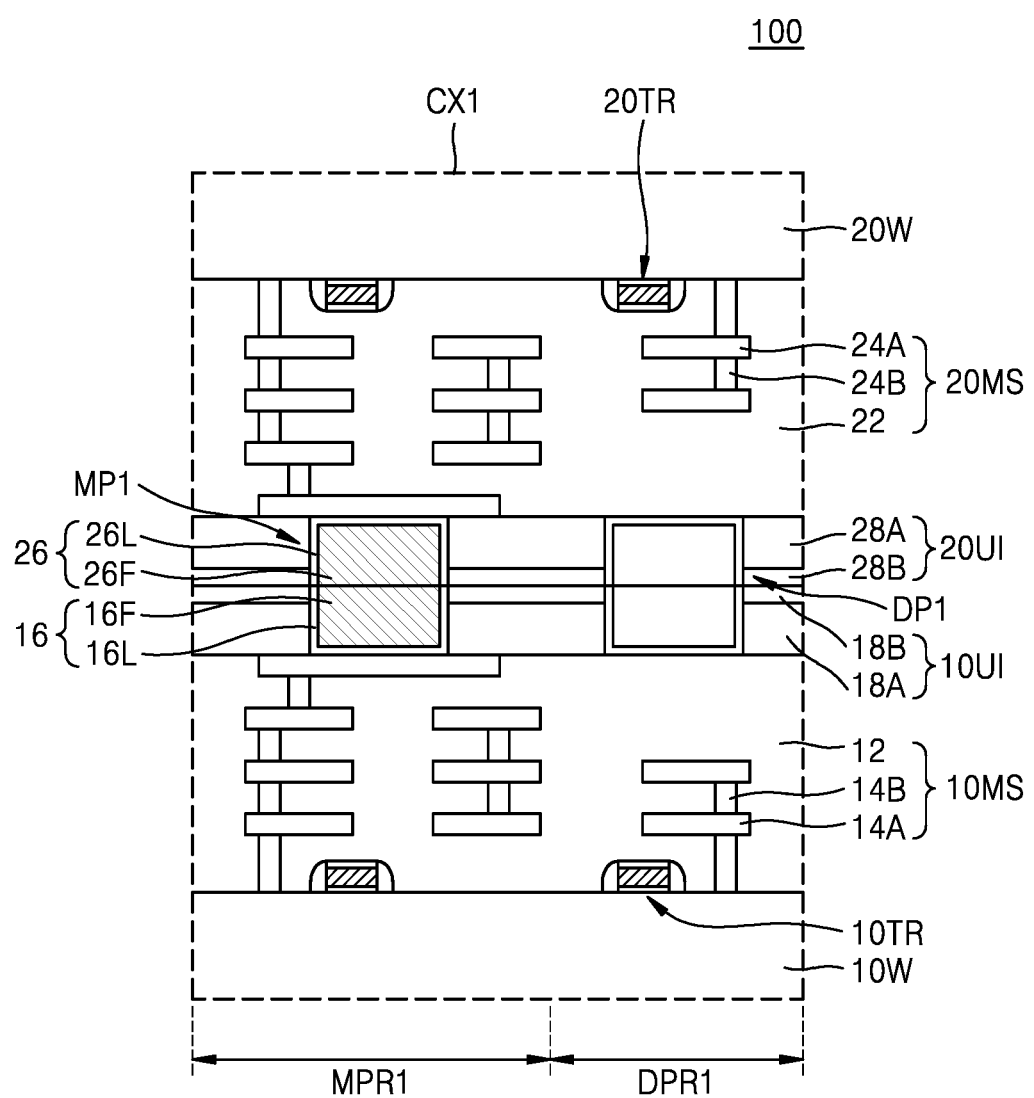
FIG. 4 is an enlarged view of a portion CX1 of FIG. 3.

FIG. 1 is a layout diagram of a semiconductor package 100 according to an example embodiment. FIG. 2 is a schematic diagram illustrating an example of a pad arrangement of FIG. 1. FIG. 3 is a cross-sectional view taken along line A1-A1' of FIG. 2. FIG. 4 is an enlarged view of a portion CX1 of FIG. 3.

Referring to FIGS. 1 to 4, the semiconductor package 100 may have a structure in which a first semiconductor chip 10C is attached to a second semiconductor chip 20C. The first semiconductor chip 10C may include a first substrate 10W and a first wiring structure 10MS on the first substrate 10W. The second semiconductor chip 20C may include a second substrate 20W and a second wiring structure 20MS on the second substrate 20W.

A first main connection pad structure MP1 and a dummy connection pad structure DP may be arranged between the first semiconductor chip 10C and the second semiconductor chip 20C (e.g., at an interface between the first semiconductor chip 10C and the second semiconductor chip 20C). A first bonding insulating layer 10UI and a second bonding insulating layer 20UI surrounding the first main connection pad structure MP1 and the dummy connection pad structure DP may be arranged between the first semiconductor chip 10C and the second semiconductor chip 20C (e.g., at an interface between the first semiconductor chip 10C and the second semiconductor chip 20C). The first semiconductor chip 10C and the second semiconductor chip 20C may be attached to each other through a metal-oxide hybrid bonding by the first main connection pad structure MP1, the dummy connection pad structure DP, the first bonding insulating layer 10UI, and the second bonding insulating layer 20UI. Each connection pad "structure" described herein may refer to a combination of two pads connected through a pad to pad bonding process. As shown in the various figures, a plurality of connection pad structures may be arranged in a matrix pattern. Though a first main connection pad structure MP1, and first through third dummy connection pad structures DP1 through DP3 are at times described in connection with only one such structure, each of the structures included in each pad region may have the same properties as discussed in connection with the singly described connection pad structure.

As shown in FIG. 1, the first semiconductor chip 10C and the second semiconductor chip 20C may have a first main pad region MPR1 in a center region thereof and a scribe lane region SR in an edge region thereof, and may have a dummy pad region DPR between the first main pad region MPR1 and the scribe lane region SR. The dummy pad region DPR may include a first dummy pad region DPR1 surrounding the first main pad region MPR1, a second dummy pad region DPR2 surrounding the first dummy pad region DPR1, and a third dummy pad region DPR3 surrounding the second dummy pad region DPR2. The first dummy pad region DPR1 may be described as a first dummy pad ring region, since it has a ring shape surrounding the first main pad region MPR1. The second dummy pad region DPR2 may be described as a second dummy pad ring region, since it has a ring shape surrounding both the first main pad region MPR1 and the first dummy pad region DPR1. The third dummy pad region DPR3 may be described as a third dummy pad ring region, since it has a ring shape surrounding the first main pad region MPR2, the first dummy pad region DPR1, and the second dummy pad region DPR2. The regions may also be described as an innermost central region (e.g., MPR1), a first surrounding ring region (e.g., DPR1), a second surrounding ring region (e.g., DPR2), and an outermost ring region (e.g., DPR3).

A plurality of first main connection pad structures MP1 may be arranged in the first main pad region MPR1 and may have a first main pad density D_MP1. Herein, the first main pad density D_MP1 may be a ratio of a sum of areas of all of the first main connection pad structures MP1 in the first main pad region MPR1 to an area of the first main pad region MPR1 in a plan view (that is, when viewed from the top of the first semiconductor chip 10C, described as a top-down view). For example, the first main pad density D_MP1 may be about 5% to about 50%, or about 0.05 to about 0.5.

The dummy connection pad structures DP may include first through third dummy connection pad structures DP1, DP2, and DP3. The first dummy connection pad structures DP1 may be arranged in the first dummy pad region DPR1 and may have a first dummy pad density D_DP1. The second dummy connection pad structures DP2 may be arranged in the second dummy pad region DPR2 and may have a second dummy pad density D_DP2. The third dummy connection pad structures DP3 may be arranged in the third dummy pad region DPR3 and may have a third dummy pad density D_DP3. Each respective dummy pad density may be a ratio of a sum of areas of all dummy pad structures of a respective dummy pad region to an area of the corresponding dummy pad region (e.g., ring region), when viewed from the top-down view. These densities may also be described as dummy pad area densities (e.g., a dummy pad area density in a particular dummy pad region). The dummy pad density may also refer to a number of dummy pads per given area, which may also have the gradually increasing/decreasing relationships described below. For example, the first through third dummy pad densities D_DP1, D_DP2, and D_DP3 may be about 1% to about 40%, or about 0.01 to about 0.4.

In example embodiments, the first through third dummy pad densities D_DP1, D_DP2, and D_DP3 may gradually decrease. For example, the first dummy pad density D_DP1 may be less than the first main pad density D_MP1, the second dummy pad density D_DP2 may be less than the first dummy pad density D_DP1, and the third dummy pad density D_DP3 may be less than the second dummy pad density D_DP2 (that is, D_DP3<D_DP2<D_DP1<D_MP1).

In example embodiments, the first through third dummy pad densities D_DP1, D_DP2, and D_DP3 may have values according to a dummy gradient rule. The dummy gradient rule may determine the first through third dummy pad densities D_DP1, D_DP2, and D_DP3 based on a value of the first main pad density D_MP1. The dummy gradient rule may divide the dummy pad region DPR into n sub-dummy pad regions (e.g., sub-dummy pad ring regions) based on values of the first main pad density D_MP1 and a reference pad density DCR, and a pad density of each of the n sub-dummy pad regions may be different from each other. For example, in an embodiment shown in FIG. 1, the dummy pad region DPR may include three sub-dummy pad regions, and the three sub-dummy pad regions may respectively correspond to the first through third dummy pad regions DPR1, DPR2, and DPR3.

For example, the dummy pad region DPR may include n sub-dummy pad regions, and n may be determined by Equation 1.

$$(D\_MP1)/(DCR)-1 \leq n < (D\_MP1)/(DCR) \quad \text{Equation 1,}$$

where n is a natural number, DCR is the reference pad density, and D_MP1 is the first main pad density.

In example embodiments, the reference pad density DCR may be about 2% to about 5%. However, the reference pad density DCR is not limited thereto, and may have different values according to applications of the first semiconductor chip 10C and the second semiconductor chip 20C.

For example, when the first main pad density D_MP1 is 15% and the reference pad density DCR is 3%, the dummy pad region DPR may include four sub-dummy pad regions based on Equation 1. For example, when the first main pad density D_MP1 is 10% and the reference pad density DCR is 3%, the dummy pad region DPR may include three sub-dummy pad regions based on Equation 1.

A dummy pad density D_DPk of each of then sub-dummy pad regions may be determined by Equation 2.

$$D\_DPk=(n+1-k)/(n+1)*D\_MP1 \quad \text{Equation 2,}$$

where, D_DPk may be the density of a k-th sub-dummy pad region, k may be a natural number from 1 to n, and D_MP1 may be the first main pad density.

For example, when the first main pad density D_MP1 is 12% and the reference pad density DCR is 3%, the dummy pad region DPR may include three sub-dummy pad regions based on Equation 1, and the dummy pad densities of the first through third sub-dummy pad regions may be respectively 9%, 6%, and 3% based on Equation 2. For example, in an example shown in FIGS. 1 and 2, the first main pad density D_MP1 may be 12%, the first dummy pad density D_DP1 may be 9%, the second dummy pad density D_DP2 may be 6%, and the third dummy pad density D_DP3 may be 3%.

For example, when the first main pad density D_MP1 is 20% and the reference pad density DCR is 5%, the dummy pad region DPR may include three sub-dummy pad regions based on Equation 1, and the dummy pad densities of the first through third sub-dummy pad regions may be respectively 15%, 10%, and 5% based on Equation 2. For example, in an example shown in FIGS. 1 and 2, the first main pad density D_MP1 may be 20%, the first dummy pad density D_DP1 may be 15%, the second dummy pad density D_DP2 may be 10%, and the third dummy pad density D_DP3 may be 5%.

For example, a plurality of first main connection pad structures MP1 may be arranged to be apart from each other by a first main pitch P11 in a first direction (e.g., X direction, and/or Y direction), a plurality of first through third dummy connection pad structures DP1, DP2, and DP3 may be respectively arranged to be apart from each other by a first dummy pitch P21, a second dummy pitch P22, and a third dummy pitch P23 in the first direction. The first dummy pitch P21 may be greater than the first main pitch P11, the second dummy pitch P22 may be greater than the first dummy pitch P21, and the third dummy pitch P23 may be greater than the second dummy pitch P22 (that is, P11<P21<P22<P23).

As shown in FIG. 3, each first main connection pad structure MP1 may have a first width W1 in a first direction horizontal to a top surface of the first semiconductor chip 10C, each of the first through third dummy connection pad structures DP1, DP2, and DP3 may have a second width W2 in the first direction, and the second width W2 may be substantially the same as the first width W1. In other embodiments, at least one of the first through third dummy connection pad structures DP1, DP2, and DP3 may have a different width or pad area from that of the first main connection pad structure MP1.

As shown in FIGS. 1 and 2, as the dummy pad densities of the dummy pad region DPR gradually decrease in a direction from a center region of the semiconductor package 100 toward the scribe lane region SR (that is, D_DP3<D_DP2<D_DP1<D_MP1), local erosion of the first and second bonding insulating layers 10UI and 20UI that may occur in a planarization operation of the first main connection pad structure MP1 may be prevented.

Although FIG. 2 illustrates that both of the first main connection pad structures MP1 and the dummy connection pad structures DP have a square planar shape, the planar shapes (e.g., as viewed from a top down view) of the first main connection pad structures MP1 and the dummy connection pad structures DP are not limited thereto and may be various shapes such as a rectangular shape, a rhombus shape, a rounded square shape, a rounded rectangular shape, an oval shape, and a circular shape. In addition, although FIG. 2 illustrates that no dummy connection pad structures DP are arranged in the scribe lane region SR, alternatively, the dummy connection pad structures DP may be arranged in at least a portion of the scribe lane region SR, for example, at the third dummy pad density D_DP3.

As shown in FIGS. 2-3, the first semiconductor chip 10C may include the first substrate 10W and the first wiring structure 10MS, the second semiconductor chip 20C may include the second substrate 20W and the second wiring structure 20MS, and the first main connection pad structures MP1 and the dummy connection pad structures DP may be arranged between, or at an interface between the first semiconductor chip 10C and the second semiconductor chip 20C.

Each first main connection pad structure MP1 and dummy connection pad structure DP may include a first connection pad 16 and a second connection pad 26 in contact with the first connection pad 16. As used herein, the term "contact" refers to a direct connection, e.g., touching. The first bonding insulating layer 10UI may be arranged on the first wiring structure 10MS to surround side surfaces of the first connection pads 16, and the second bonding insulating layer 20UI may be arranged on the second wiring structure 20MS to surround side surfaces of the second connection pads 26. As the second bonding insulating layer 20UI is in contact with the first bonding insulating layer 10UI, the first semiconductor chip 10C and the second semiconductor chip 20C may be attached to each other through the metal-oxide hybrid bonding.

The first substrate 10W and the second substrate 20W may be formed based as a Group IV material wafer such as a silicon wafer or a Group III-V compound wafer. Also, the first substrate 10W and the second substrate 20W may be formed of a single crystal wafer such as a silicon single crystal wafer in terms of a formation method. However, the first substrate 10W and the second substrate 20W are not limited to a single crystal wafer, and various wafers such as an epitaxial wafer, a polished wafer, an annealed wafer, a silicon on insulator (SOI) wafer may be used as the first substrate 10W and the second substrate 20W. Herein, an epitaxial wafer refers to a wafer in which a crystalline material is grown on a single crystal silicon substrate. In addition, the first substrate 10W and the second substrate 20W may include a well doped with impurities or a structure doped with impurities. In addition, the first substrate 10W and the second substrate 20W may include various device isolation structures such as a shallow trench isolation (STI) structure.

Each of the first and second semiconductor chips 10C and 20C may include a plurality of individual devices of various types. The plurality of individual devices may include various microelectronic devices, for example, a metal-oxide-semiconductor field effect transistor (MOSFET) such as a complementary metal-insulator-semiconductor (CMOS) transistor, a system large scale integration (LSI), an image sensor such as a CMOS imaging sensor (CIS), a micro-electro-mechanical system (MEMS), an active device, a passive device, or the like.

In example embodiments, each of the first and second semiconductor chips 10C and 20C may include at least one of a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

For example, as shown in FIG. 4, a first integrated circuit 10TR may be formed on the first substrate 10W, and a second integrated circuit 20TR may be formed on the second substrate 20W. The first and second integrated circuits 10TR and 20TR may include various semiconductor devices such as transistors, diodes, resistors, capacitors, or the like. FIG. 4 illustrates a typical transistor as an integrated circuit. A transistor may include, for example, a source/drain region, a channel region formed in a substrate, and a gate structure formed on the substrate.

The first wiring structure 10MS may be arranged on the first substrate 10W and may include a plurality of first wiring patterns 14A, a plurality of first contacts 14B, and a first interlayer insulating film 12. The first integrated circuit 10TR may exchange electrical signals with the outside through the plurality of first wiring patterns 14A and the plurality of first contacts 14B. Herein, electrical signals may include a power voltage, a ground voltage, a signal voltage, or the like. The plurality of first wiring patterns 14A may have a stack structure of a plurality of metal layers arranged at different vertical levels. The first interlayer insulating film 12 may have a stack structure of a plurality of insulating layers, and the first interlayer insulating film 12 may be arranged to cover the first integrated circuit 10TR.

The second wiring structure 20MS may be arranged on the second substrate 20W and may include a plurality of second wiring patterns 24A, a plurality of second contacts 24B, and a second interlayer insulating film 22. The second integrated circuit 20TR may exchange electrical signals with the outside through the plurality of second wiring patterns 24A and the plurality of second contacts 24B. The plurality of second wiring patterns 24A may have a stack structure of a plurality of metal layers arranged at different vertical levels. The second interlayer insulating film 22 may have a stack structure of a plurality of insulating layers, and the second interlayer insulating film 22 may be arranged to cover the second integrated circuit 20TR.

The first connection pads 16 and the first bonding insulating layer 10UI surrounding sidewalls of the first connection pads 16 may be arranged on the first wiring structure 10MS. The second connection pads 26 and the second bonding insulating layer 20UI surrounding sidewalls of the second connection pads 26 may be arranged on the second wiring structure 20MS. A top surface of each first connection pad 16 may be arranged coplanar with a top surface of the first bonding insulating layer 10UI, and a top surface of each second connection pad 26 may be arranged coplanar with a top surface of the second bonding insulating layer 20UI. The top surface of each first connection pad 16 may be in contact with the top surface of a respective second connection pad 26, and the top surface of the first bonding insulating layer 10UI may be in contact with the top surface of the second bonding insulating layer 20UI. Herein, a surface of the first connection pads 16, the surface facing the second semiconductor chip 20C, may be referred to as the top surface of the first connection pads 16, and a surface of the second connection pads 26, the surface facing the first semiconductor chip 10C, may be referred to as the top surface of the second connection pads 26. Also, terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The first connection pads 16 may each include a first metal layer 16F and a first barrier layer 16L. The first barrier layer 16L may surround sidewalls and a bottom surface of the first metal layer 16F and may be between the first metal layer 16F and the first bonding insulating layer 10UI. The first bonding insulating layer 10UI may include a first insulating layer 18A and a first bonding layer 18B, and a top surface of the first bonding layer 18B may be arranged coplanar with the top surface of the first connection pads 16.

The second connection pads 26 may each include a second metal layer 26F and a second barrier layer 26L. The second barrier layer 26L may surround sidewalls and a bottom surface of the second metal layer 26F and may be between the second metal layer 26F and second bonding insulating layer 20UI. The second bonding insulating layer 20UI may include a second insulating layer 28A and a second bonding layer 28B, and a top surface of the second bonding layer 28B may be coplanar with the top surface of the second connection pads 26 and in contact with the first bonding layer 18B.

In example embodiments, the first metal layer 16F and the second metal layer 26F may include copper (Cu), gold (Au), or an alloy thereof. The first metal layer 16F and the second metal layer 26F may be bonded by inter-diffusion of metal atoms through high-temperature annealing. The first barrier layer 16L and the second barrier layer 26L may include at least one of titanium (Ti), tantalum (Ta), titanium nitride (TiN), and tantalum nitride (TaN).

In example embodiments, the first bonding layer 18B and the second bonding layer 28B may include silicon oxide, silicon carbon nitride (SiCN), or the like. The first bonding layer 18B and the second bonding layer 28B may be bonded by applying a high-temperature annealing operation when the first bonding layer 18B and the second bonding layer 28B are in contact with each other. The first insulating layer 18A and the second insulating layer 28A may include silicon oxide. For example, the first insulating layer 18A and the second insulating layer 28A may include at least one of tetraethyl orthosilicate (TEOS), Tonen SilaZene (TOSZ), atomic layer deposition (ALD) oxide, flowable chemical vapor deposition (FCVD) oxide, high density plasma (HDP) oxide, plasma enhanced oxidation (PEOX) oxide, but are not limited thereto.

As shown in FIG. 4, each first main connection pad structure MP1 may be connected to a plurality of first wiring patterns 14A and/or the plurality of first contacts 14B to be electrically connected to the first integrated circuit 10TR, and in addition, may be connected to the plurality of second wiring patterns 24A or the plurality of second contacts 24B to be electrically connected to the second integrated circuit 20TR. The first main connection pad structures MP1 may therefore be used to communicate or transfer signals from/to outside a respective semiconductor chip to/from an integrated circuit of the semiconductor chip. The dummy connection pad structures DP may not be connected to the plurality of first wiring patterns 14A or the plurality of second wiring patterns 24A, and/or may not be connected to any integrated circuit component of the respective semiconductor chip. As such, the dummy connection pad structures DP in this embodiment are not connected to transfer any signals to or from any integrated circuits of the respective semiconductor chip. The dummy connection pad structures DP may not be connected to transmit any signals to or from either of the two semiconductor chips (e.g., the first semiconductor chip 10C or the second semiconductor chip 20C). In some embodiments, the dummy pads structures may be conductive pads that are entirely surrounded by insulative material and thus are not directly connected to any other conductive components.

In the semiconductor package 100 according to the above-stated example embodiments, the dummy connection pad structures DP may be arranged to have a dummy pad density that varies according to the dummy gradient rule. Accordingly, local erosion of the first and second bonding insulating layers 10UI and 20UI may be prevented from occurring in a planarization operation of the first main connection pad structures MP1 and the dummy connection pad structures DP, and thus, occurrence of defects in a bonding operation of the first semiconductor chip 10C and the second semiconductor chip 20C may be minimized.

Figure 5:
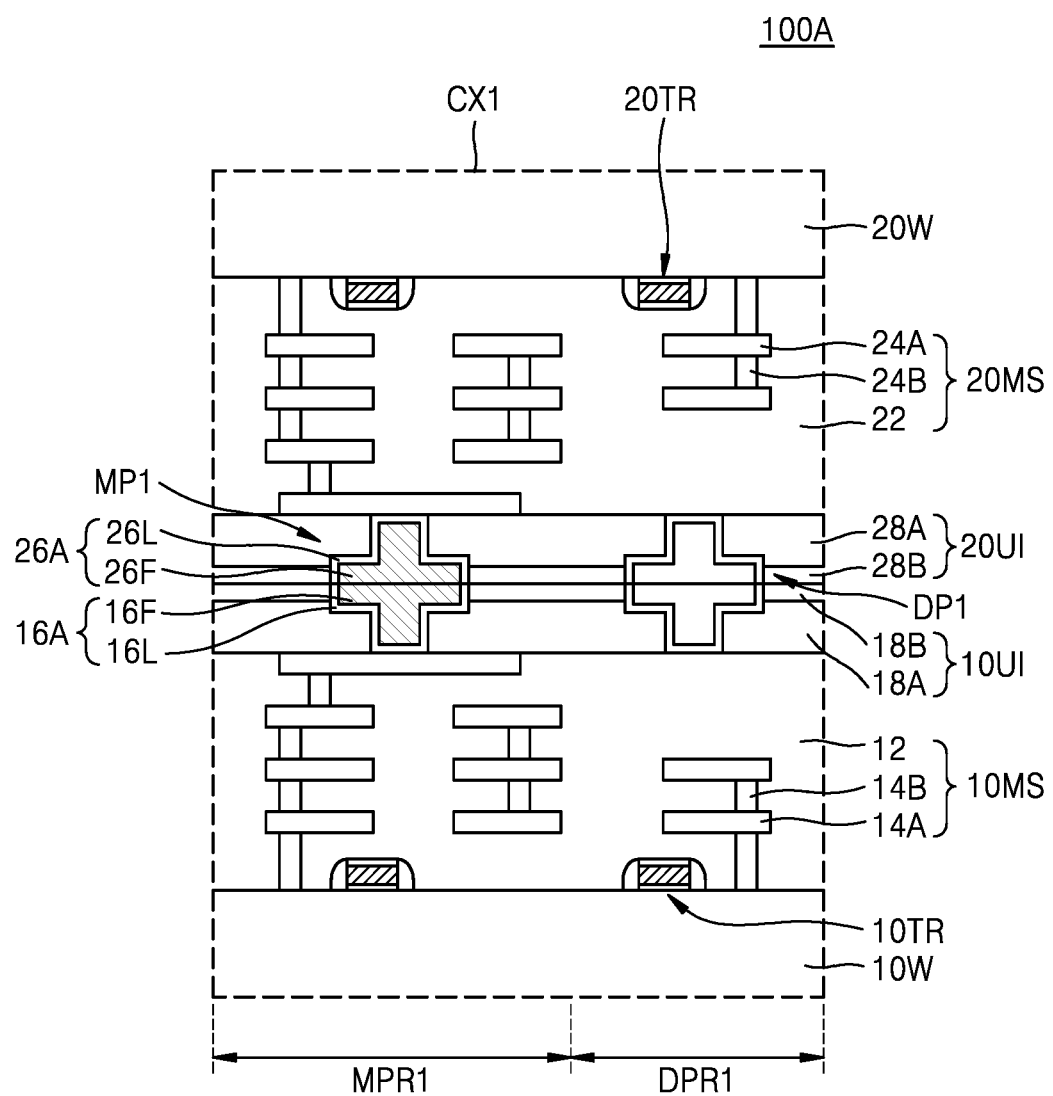
FIG. 5 is a cross-sectional view of a semiconductor package according to an example embodiment.

FIG. 5 is a cross-sectional view of a semiconductor package 100A according to an example embodiment. FIG. 5 is an enlarged view of a portion corresponding to the region CX1 of FIG. 3. In FIG. 5, the same reference numerals as in FIGS. 1 to 4 denote the same components.

Referring to FIG. 5, a first connection pad 16A and a second connection pad 26A may be formed through a dual damascene operation. Each of the first connection pad 16A and the second connection pad 26A may have a structure in which the width of a lower portion (e.g., a portion further from an interface between the first semiconductor chip 10C and second semiconductor chip 20C) is narrow and the width of an upper portion (e.g., a portion closer to an interface between the first semiconductor chip 10C and second semiconductor chip 20C) is wide. Because a contact area of the first connection pad 16A and the second connection pad 26A may be larger, a more rigid bonding of the first connection pad 16A and the second connection pad 26A may be maintained.

Figure 6:
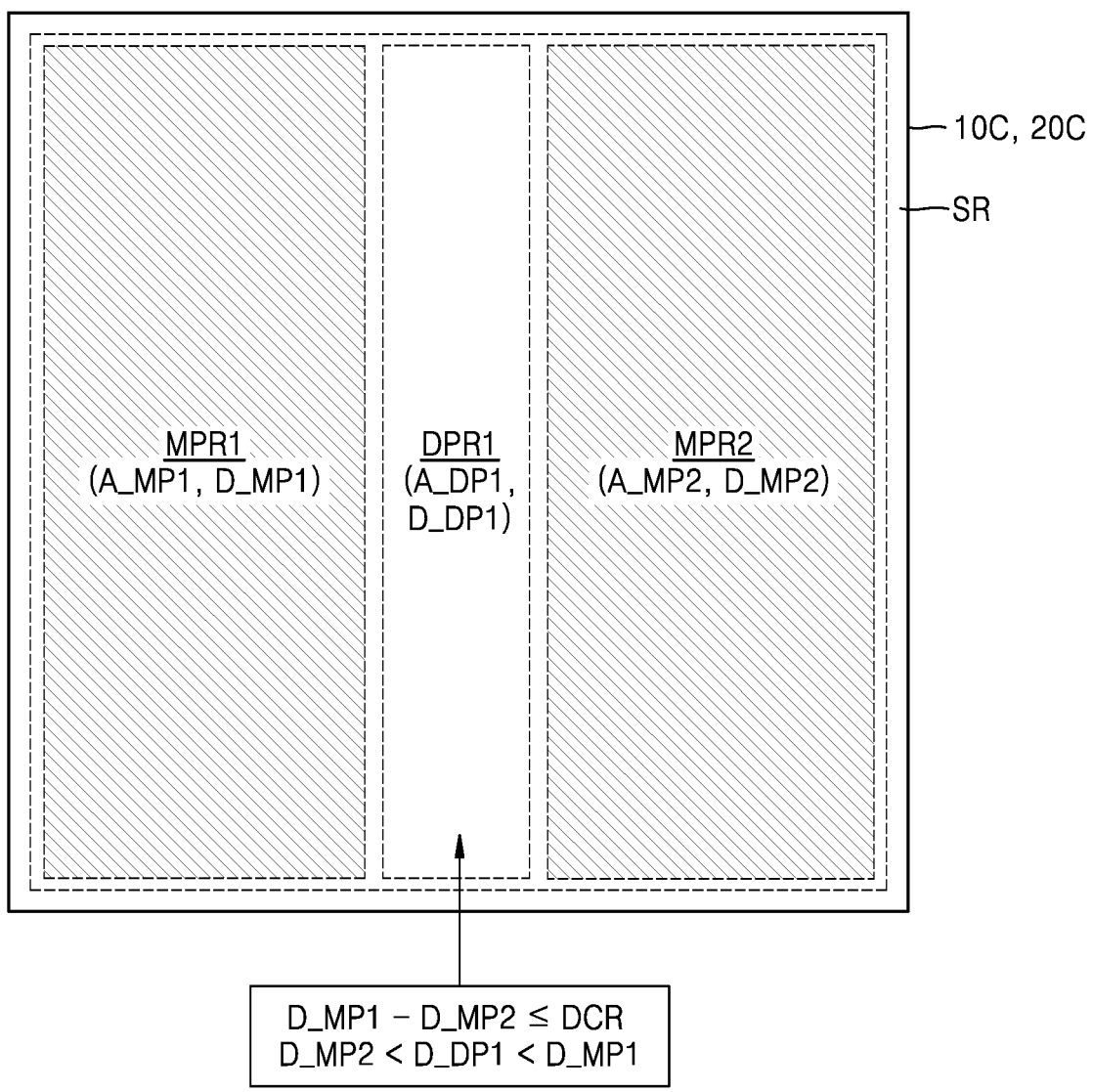
FIG. 6 is a layout diagram of a semiconductor package according to an example embodiment.
Figure 7:
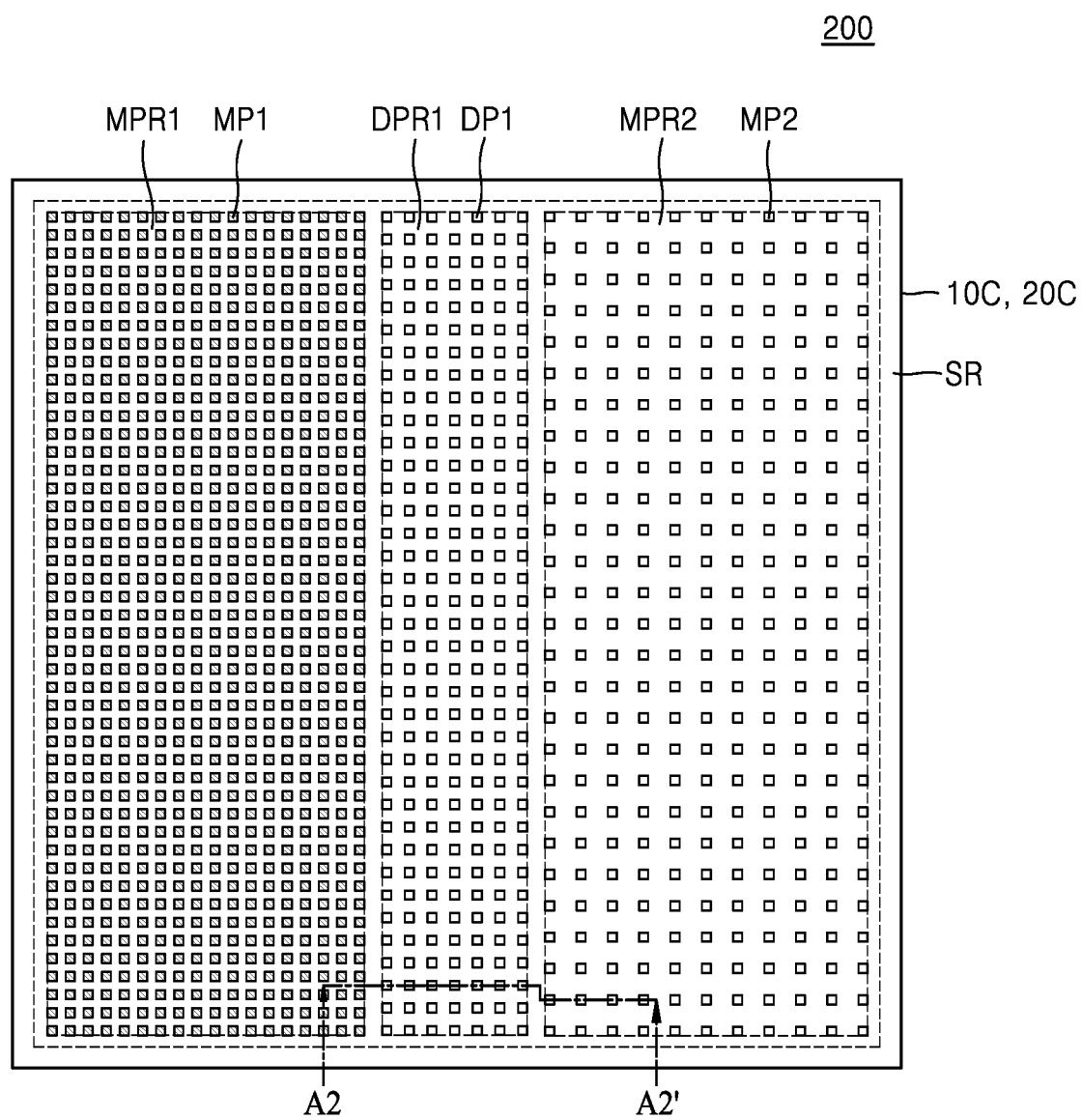
FIG. 7 is a schematic diagram illustrating an example of a pad arrangement of FIG. 6.
Figure 8:
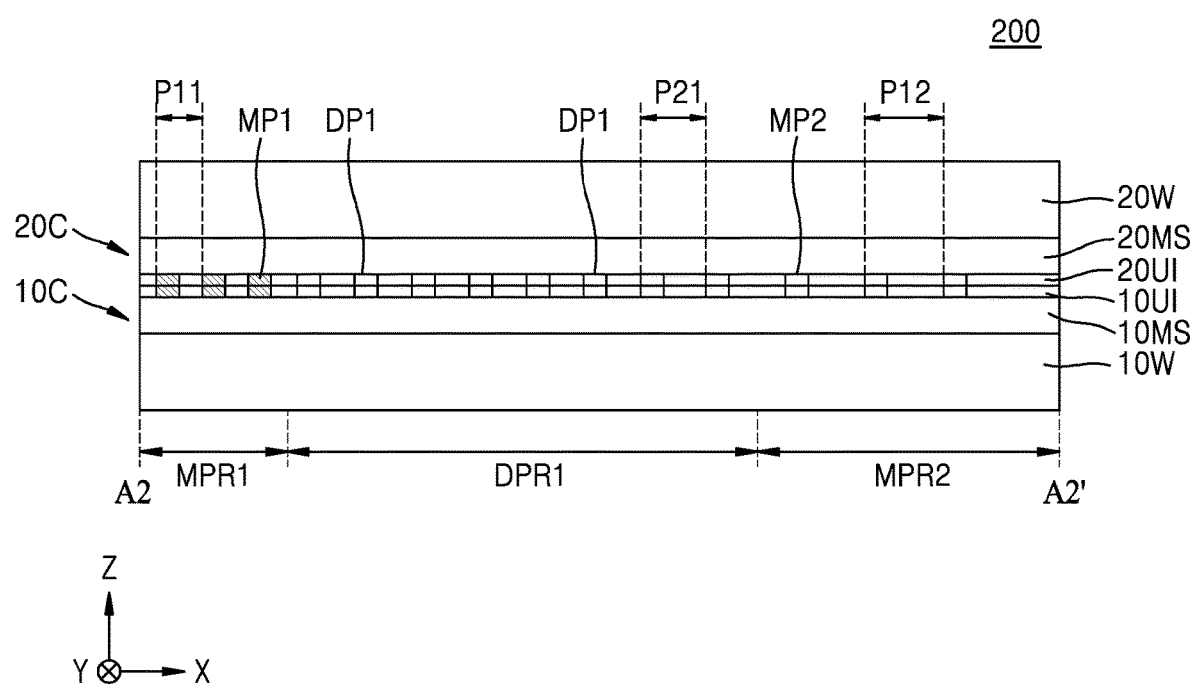
FIG. 8 is a cross-sectional view taken along line A1-A1' of FIG. 7.

FIG. 6 is a layout diagram of a semiconductor package 200 according to an example embodiment. FIG. 7 is a schematic diagram illustrating an example of a pad arrangement of FIG. 6. FIG. 8 is a cross-sectional view taken along line A2-A2' of FIG. 7.

Referring to FIGS. 6 to 8, the first main connection pad structures MP1, a second main connection pad structures MP2, and the first dummy connection pad structures DP1 may be arranged at an interface between the first semiconductor chip 10C and the second semiconductor chip 20C.

The first main connection pad structures MP1 may be arranged in the first main pad region MPR1 and may have a first main pad density D_MP1. The second main connection pad structures MP2 may be arranged in a second main pad region MPR2 and may have a second main pad density D_MP2. The first dummy connection pad structures DP1 are arranged in the first dummy pad region DPR1, and the first dummy pad region DPR1 is arranged between the first main pad region MPR1 and the second main pad region MPR2. The first dummy connection pad structure DP1 may have the first dummy pad density D_DP1. In example embodiments, the first dummy pad density D_DP1 may be less than the first main pad density D_MP1 and greater than the second main pad density D_MP2 (that is, D_MP2<D_DP1<D_MP1).

In example embodiments, the first dummy pad density D_DP1 may have values according to a dummy gradient rule. The dummy gradient rule may determine the first dummy pad density D_DP1 based on a difference value between the first main pad density D_MP1 and the second main pad density D_MP2. For example, when the difference value between the first main pad density D_MP1 and the second main pad density D_MP2 is less than the reference pad density DCR, the first dummy pad region DPR1 may have a single pad density, and the first dummy pad density D_DP1 may be determined based on Equations 3 to 5.

$$D\_DP1 = k1 * D\_MP1 + k2 * D\_MP2 \qquad \text{Equation 3,}$$

$$k1 = A\_MP1 / (A\_MP1 + A\_MP2 + A\_DP1) \qquad \text{Equation 4,}$$

$$k2 = A\_MP2 / (A\_MP1 + A\_MP2 + A\_DP1) \qquad \text{Equation 5,}$$

where D_DP1 is the first dummy pad density, D_MP1 is the first main pad density, D_MP2 is the second main pad density, A_DP1 is an area of the first dummy pad region, A_MP1 is an area of the first main pad region, and A_MP2 is an area of the second main pad region.

For example, when the first main pad density D_MP1 is 10%, the second main pad density D_MP2 is 8%, the areas of the first main pad region MPR1 and the second main pad region MPR2 are each 40% (of the total area that includes pads), and the reference pad density DCR is 3%, the first dummy pad density D_DP1 may be 9.33% based on Equations 3 to 5.

As shown in FIG. 8, the plurality of first main connection pad structures MP1 may be arranged to be apart from each other by the first main pitch P11 in a first direction, a plurality of second main connection pad structures MP2 may be arranged to be apart from each other by a second main pitch P12 in the first direction, and the plurality of first dummy connection pad structures DP1 may be arranged to be apart from each other by the first dummy pitch P21 in the first direction. The first dummy pitch P21 may be greater than the first main pitch P11 and less than the second main pitch P12 (that is, P11<P21<P12).

In addition, when a distance between the first main pad region MPR1 and the second main pad region MPR2 is less than a sum of the first main pitch P11 and the first width W1 (refer to FIG. 3) or a sum of the second main pitch P12 and the first width W1, a dummy pad may not be arranged between the first main pad region MPR1 and the second main pad region MPR2.

For example, when the first main pad region MPR1 and the second main pad region MPR2 are arranged to have different pad densities from each other and the difference in pad density between them is less than or equal to the reference pad density DCR, the first dummy pad region DPR1 arranged between the first main pad region MPR1 and the second main pad region MPR2 may be determined according to the dummy gradient rule, and local erosion of the first and second bonding insulating layers 10UI and 20UI, which may occur in a planarization operations of the first main connection pad structure MP1 and the second main connection pad structure MP2, may be prevented or reduced.

Figure 9:
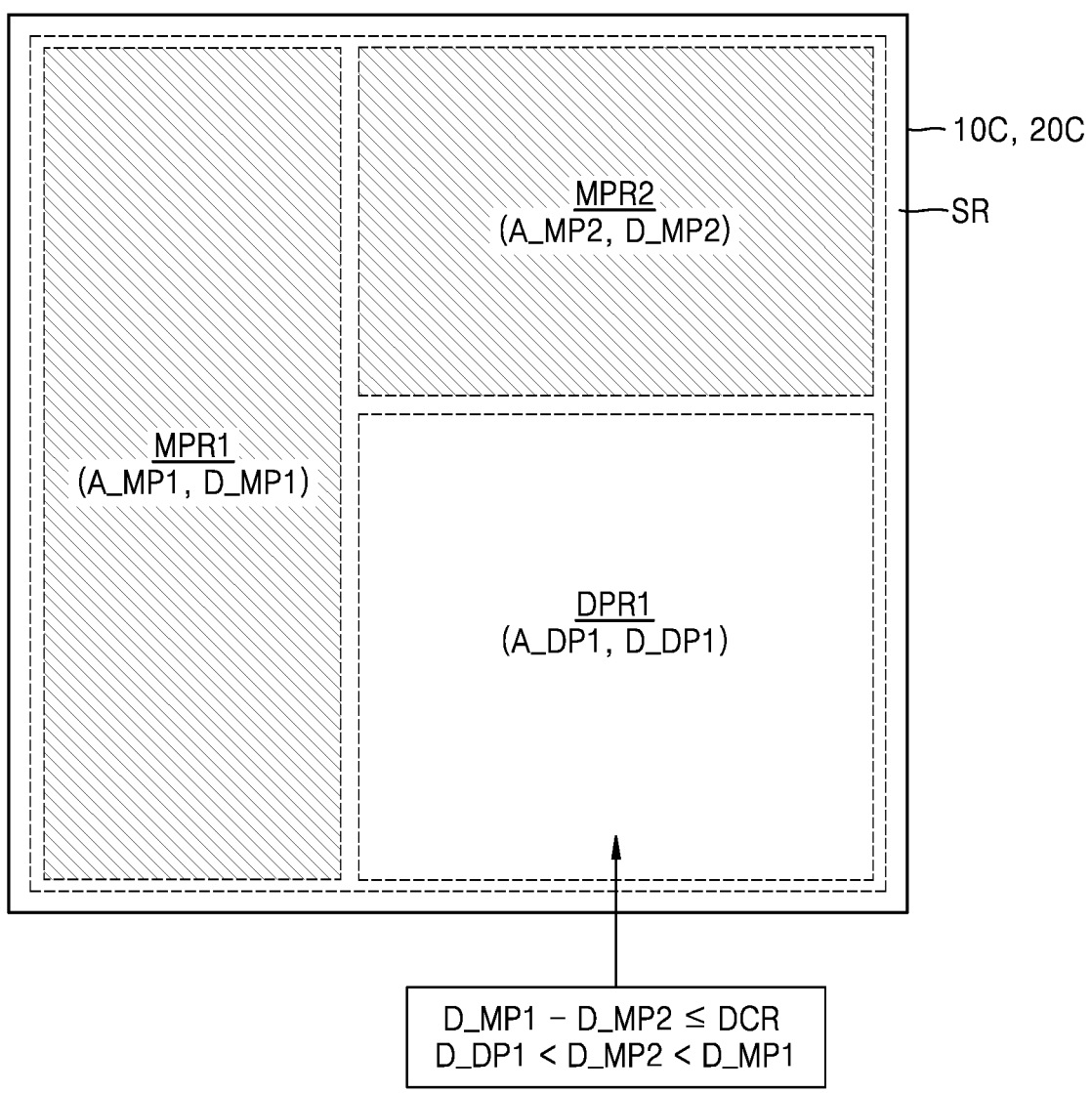
FIG. 9 is a layout diagram of a semiconductor package according to an example embodiment.

FIG. 9 is a layout diagram of a semiconductor package 200A according to an example embodiment.

Referring to FIG. 9, a difference value between the first main pad density D_MP1 and the second main pad density D_MP2 may be less than or equal to the reference pad density DCR. The first dummy connection pad structure DP1 may be arranged in the first dummy pad region DPR1, the first dummy pad density D_DP1 may be less than the first main pad density D_MP1 and less than the second main pad density D_MP2 (that is, D_DP1<D_MP2<D_MP1).

In example embodiments, the first dummy pad density D_DP1 may have a value according to the dummy gradient rule, and the first dummy pad density D_DP1 may be determined based on Equations 3 to 5 described with reference to FIGS. 6 to 8. For example, when the first main pad density D_MP1 is 10%, the second main pad density D_MP2 is 8%, the areas of the first main pad region MPR1 and the second main pad region MPR2 are each 30% (of the total area that includes pads), and the reference pad density DCR is 3%, the first dummy pad density D_DP1 may be 6.42% based on Equations 3 to 5.

For example, when the first main pad region MPR1 and the second main pad region MPR2 are arranged to have different pad densities from each other and the difference in pad density between them is less than or equal to the reference pad density DCR, the first dummy pad region DPR1 arranged between the first main pad region MPR1 and the second main pad region MPR2 may be determined according to the dummy gradient rule, and local erosion of the first and second bonding insulating layers 10UI and 20UI, which may occur in the planarization operation of the first main connection pad structure MP1 and the second main connection pad structure MP2, may be prevented or reduced.

Figure 10:
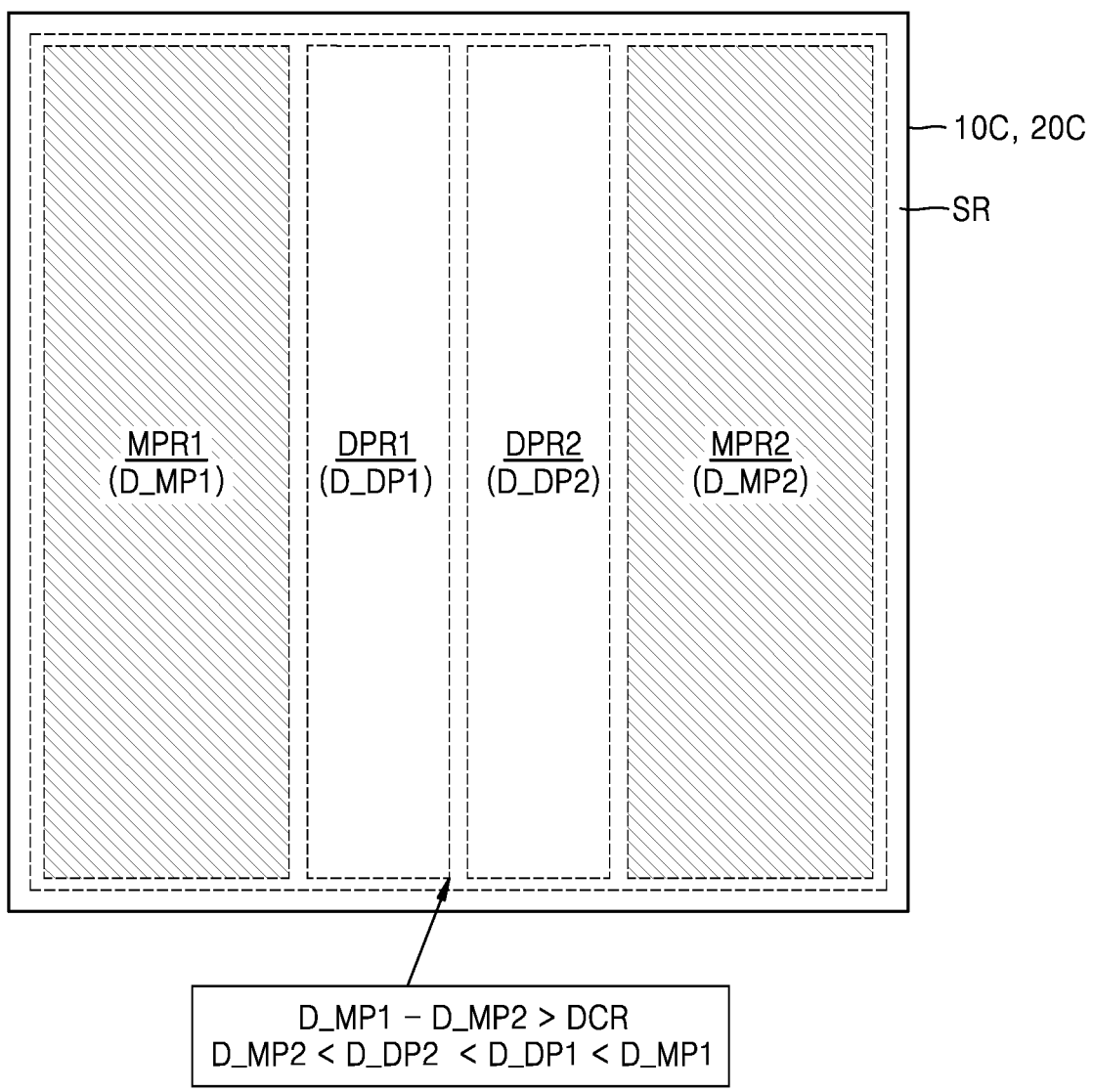
FIG. 10 is a layout diagram of a semiconductor package according to an example embodiment.

FIG. 10 is a layout diagram of a semiconductor package 200B according to an example embodiment.

Referring to FIG. 10, a difference value between the first main pad density D_MP1 and the second main pad density D_MP2 may be greater than the reference pad density DCR. The dummy pad region DPR may be divided into n sub-dummy pad regions according to the dummy gradient rule, and a pad density of each of the n sub-dummy pad regions may vary. For example, in an embodiment shown in FIG. 10, the dummy pad region DPR may include two sub-dummy pad regions, and the two sub-dummy pad regions may correspond to the first and second dummy pad regions DPR1 and DPR2. Note, however, that ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

For example, the dummy pad region DPR may include n sub-dummy pad regions, and n may be determined by Equation 6.

$$(D\_MP1-D\_MP2)/(DCR)-1 \leq n < (D\_MP1-D\_MP2)/(DCR) \quad \text{Equation 6,}$$

where n is a natural number, DCR is the reference pad density, D_MP1 is the first main pad density, and D_MP2 is the second main pad density.

In addition, a k-th sub-dummy pad region may have a sub-dummy pad density according to Equation 7. Herein, when the dummy pad region DPR includes n sub-dummy pad regions, a sub-dummy pad region closest to the first main pad region MPR1 may be referred to as a first sub-dummy pad region, and a sub-dummy pad region closest to the second main pad region MPR2 may be referred to as a n-th sub-dummy pad region.

$$D\_DPk = (n+1-k)/(n+1)*D\_MP1 + (k)/(n+1)*D\_MP2 \quad \text{Equation 7,}$$

where D_DPk is the density of a k-th sub-dummy pad region, k is a natural number from 1 to n, D_MP1 is the first main pad density, and D_MP2 is the second main pad density.

For example, when the first main pad density D_MP1 is 16%, the second main pad density D_MP2 is 10%, and the reference pad density DCR is 2%, the dummy pad region DPR may include two sub-dummy pad regions based on Equation 6. In addition, the first dummy pad density D_DP1 of the first dummy pad region DPR1 may be 14%, and the second dummy pad density D_DP2 of the second dummy pad region DPR2 may be 12%, based on Equation 7. In this embodiment, the first dummy pad density D_DP1 may be less than the first main pad density D_MP1, the second dummy pad density D_DP2 may be less than the first dummy pad density D_DP1, and the second main pad density D_MP2 may be less than the second dummy pad density D_DP2 (that is, D_MP2<D_DP2<D_DP1<D_MP1).

For example, even when the first main pad region MPR1 and the second main pad region MPR2 are arranged to have different pad densities from each other and the difference in pad density between them is greater than the reference pad density DCR, the first dummy pad region DPR1 and the second dummy pad region DPR2 may have pad densities that gradually vary according to the dummy gradient rule, and accordingly, local erosion of the first and second bonding insulating layers 10UI and 20UI, which may occur in the planarization operation of the first main connection pad structure MP1 and the second main connection pad structure MP2, may be prevented or reduced.

Figure 11:
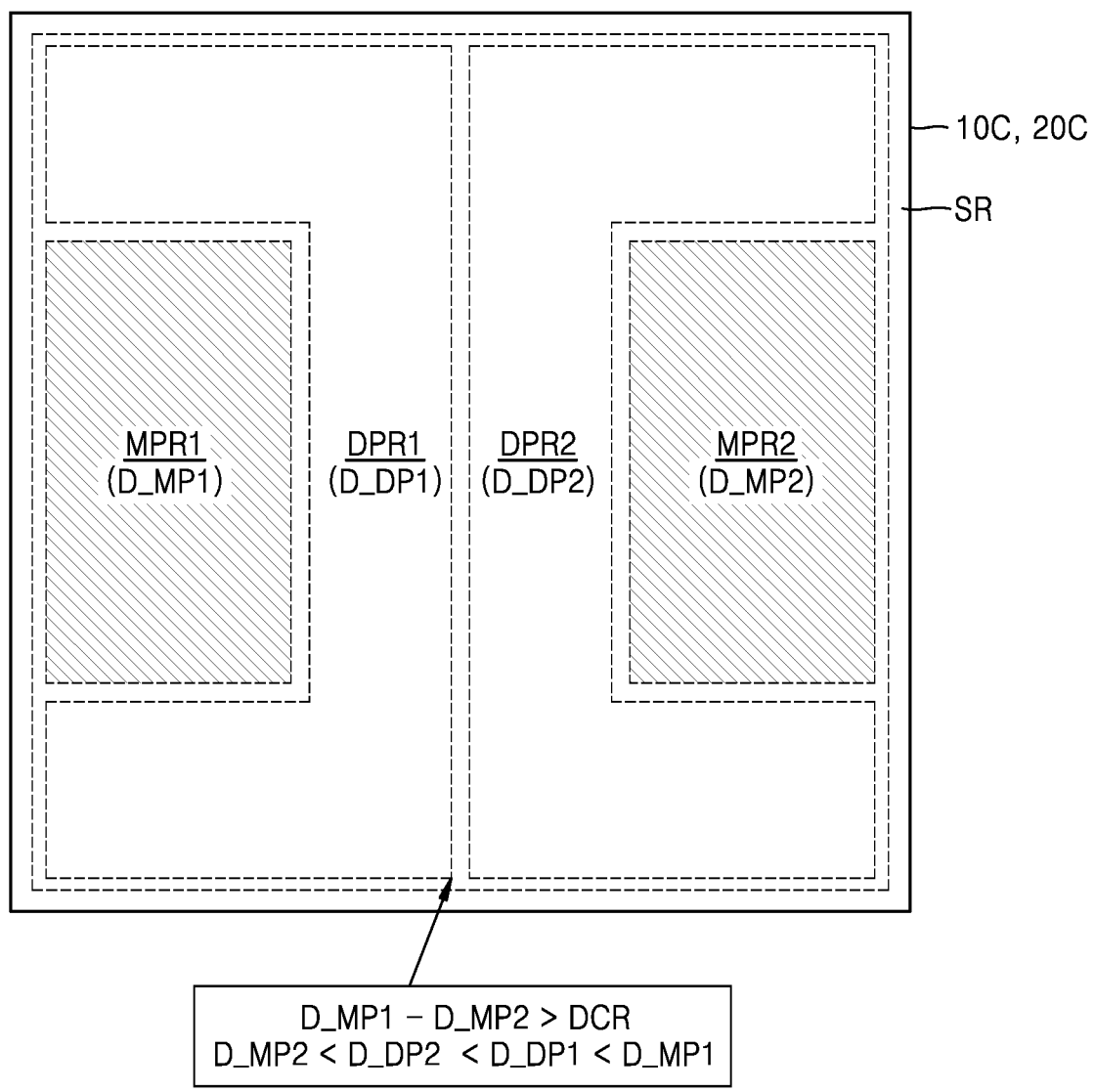
FIG. 11 is a layout diagram of a semiconductor package according to an example embodiment.

FIG. 11 is a layout diagram of a semiconductor package 200C according to an example embodiment.

Referring to FIG. 11, unlike the semiconductor package 200B described with reference to FIG. 10, in a plan view, the first dummy pad region DPR1 may be arranged to surround the first main pad region MPR1, and the second dummy pad region DPR2 may be arranged to surround the second main pad region MPR2 (e.g., on three sides).

The semiconductor packages 100, 100A, 200, 200A, 200B, and 200C according to example embodiments described with reference to FIGS. 1 to 11 may be manufactured by attaching the first semiconductor chip 10C and the second semiconductor chip 20C by the metal-oxide hybrid bonding through a connection pad structure and first and second bonding insulating layers 10UI and 20UI. The connection pad structure may include first and second main connection pad structures MP1 and MP2 formed in the first and second main pad regions MPR1 and MPR2 and the dummy connection pad structures DP formed in the dummy pad region DPR. In these embodiments, the pad density of the dummy pad region DPR may be determined according to a dummy gradient rule.

An example dummy gradient rule is as follows.

First, when a semiconductor package includes one main pad region MPR1, the dummy pad region DPR may include n sub-dummy pad regions, and n may be determined by Equation 1.

$$(D\_MP1)/(DCR)-1 \leq n < (D\_MP1)/(DCR) \qquad \text{Equation 1,}$$

where n is a natural number, DCR is the reference pad density, and D_MP1 is the first main pad density.

In addition, a dummy pad density D_DPk of each of the n sub-dummy pad regions may be determined by Equation 2.

$$D\_DPk=(n+1-k)/(n+1)*D\_MP1 \qquad \text{Equation 2,}$$

where D_DPk may be the density of a k-th sub-dummy pad region, k may be a natural number from 1 to n, and D_MP1 may be the first main pad density.

Second, when a semiconductor package includes the first main pad region MPR1 and the second main pad region MPR2 having different pad densities from each other and a difference value between the first main pad density D_MP1 and the second main pad density D_MP2 is less than the reference pad density DCR, the first dummy pad area DPR1 may include a single pad density, and the first dummy pad density D_DP1 may be determined based on Equations 3 to 5.

$$D\_DP1=k1*D\_MP1+k2*D\_MP2 \qquad \text{Equation 3,}$$

$$k1=A\_MP1/(A\_MP1+A\_MP2+A\_DP1) \qquad \text{Equation 4,}$$

$$k2=A\_MP2/(A\_MP1+A\_MP2+A\_DP1) \qquad \text{Equation 5,}$$

where D_DP1 is the first dummy pad density, D_MP1 is the first main pad density, D_MP2 is the second main pad density, A_DP1 is the area of the first dummy pad region, A_MP1 is the area of the first main pad region, and A_MP2 is the area of the second main pad region.

Third, when a semiconductor package includes the first main pad region MPR1 and the second main pad region MPR2 having different pad densities from each other and a difference value between the first main pad density D_MP1 and the second main pad density D_MP2 is greater than the reference pad density DCR, the dummy pad region DPR may include n sub-dummy pad regions, and n may be determined by Equation 6.

$$(D\_MP1-D\_MP2)/(DCR)-1 \leq n < (D\_MP1-D\_MP2)/(DCR) \qquad \text{Equation 6,}$$

where n is a natural number, DCR is the reference pad density, D_MP1 is the first main pad density, and D_MP2 is the second main pad density.

In addition, a k-th sub-dummy pad region among the n sub-dummy pad regions may have a sub-dummy pad density according to Equation 7.

$$D\_DPk=(n+1-k)/(n+1)*D\_MP1+(k)/(n+1)*D\_MP2 \qquad \text{Equation 7,}$$

where D_DPk is the density of the k-th sub-dummy pad region, and k is a natural number from 1 to n. For example, n may be in a range from 2-10.

In summary, the dummy connection pad structure DP may be arranged to have a dummy pad density that varies according to the dummy gradient rule. Accordingly, local erosion of the first and second bonding insulating layers 10UI and 20UI may be reduced or prevented from occurring in a planarization operation of the first and second main connection pad structures MP1 and MP2 and the dummy connection pad structure DP, and thus, occurrence of defects in a bonding operation of the first semiconductor chip 10C and the second semiconductor chip 20C may be minimized.

Figure 12:
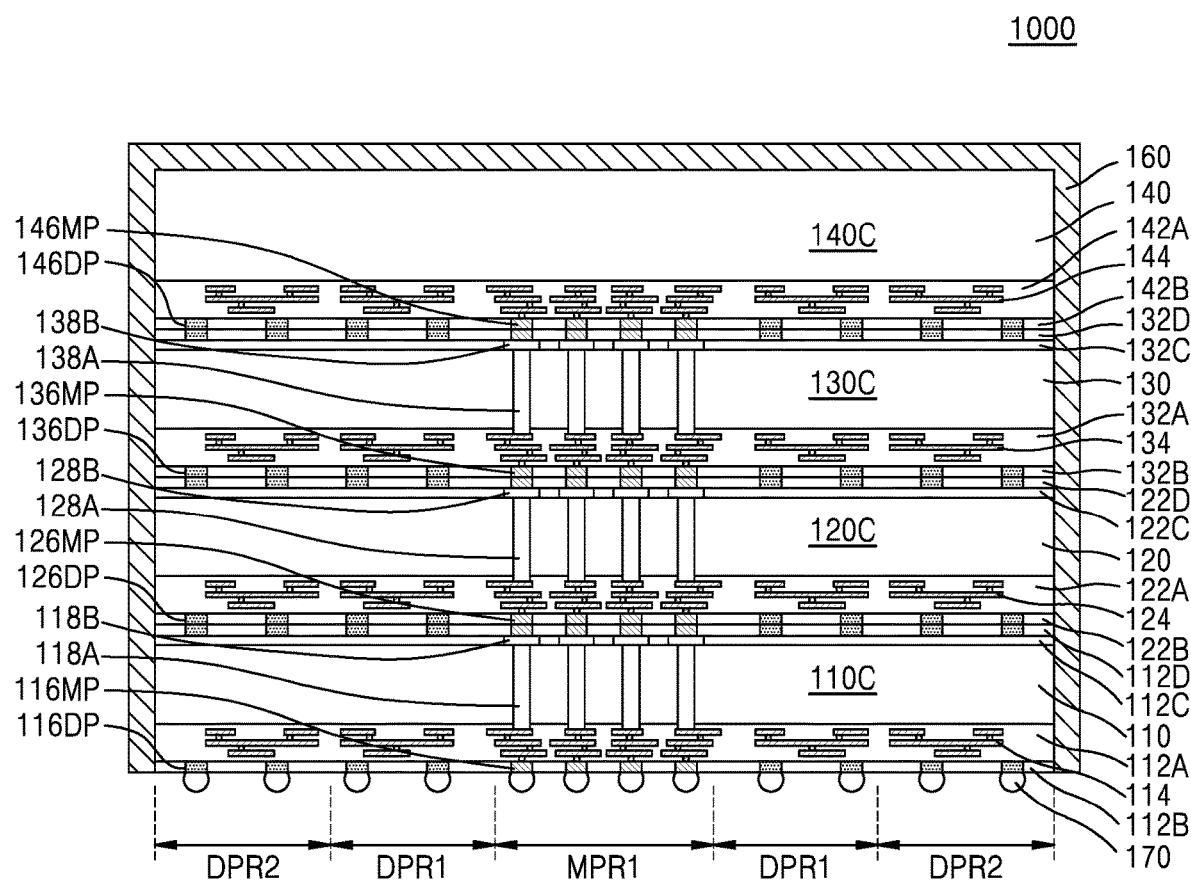
FIG. 12 is a cross-sectional diagram of a semiconductor package according to an example embodiment.

FIG. 12 is a cross-sectional diagram of a semiconductor package 1000 according to an example embodiment.

Referring to FIG. 12, the semiconductor package 1000 may include a first semiconductor chip 110C, a second semiconductor chip 120C, a third semiconductor chip 130C, and a fourth semiconductor chip 140C. The first semiconductor chip 110C may include a wiring layer 114 and an interlayer insulating film 112A arranged on a first surface of a first substrate 110, and a bonding insulating layer 112B, main connection pads 116MP, and dummy connection pads 116DP may be arranged on the interlayer insulating film 112A. An upper insulating layer 112C and a bonding insulating layer 112D may be arranged on a second surface of the first substrate 110.

Similarly, the second through fourth semiconductor chips 120C, 130C, and 140C may respectively include wiring layers 124, 134, and 144 and interlayer insulating films 122A, 132A, and 142A arranged on first surfaces of second through fourth substrates 120, 130, and 140, and bonding insulating layers 122B, 132B, and 142B, main connection pads 126MP, 136MP, and 146MP, and dummy connection pads 126DP, 136DP, and 146DP may be arranged on the interlayer insulating films 122A, 132A, and 142A. Upper insulating layers 122C and 132C and bonding insulating layers 122D and 132D may be arranged on second surfaces of the second and third substrates 120 and 130. Adjacent semiconductor chips of the semiconductor package 1000 may be connected using one of the main and dummy connection pad arrangements described previously in connection with FIGS. 1-11. That is, FIG. 12 may include the connection pad arrangement for connecting the semiconductor chips of the semiconductor package 1000 for any of the embodiments of FIGS. 1-11. In one embodiment, all of the semiconductor chips of semiconductor package 1000 are bonded to adjacent chips using the same connection pad arrangement (e.g., one of the embodiments of FIGS. 1-11). In another embodiment, certain semiconductor chips of semiconductor package 1000 may be bonded to different adjacent chips using different connection pad arrangements (e.g., different embodiments from FIGS. 1-11). The same applies to FIGS. 13 and 14, discussed further below.

The first semiconductor chip 110C may further include a through via 118A penetrating the first substrate 110 and an upper wiring layer 118B arranged on the second surface of the first substrate 110 and connecting the through via 118A to the main connection pads 126MP. Similarly, the second and third semiconductor chips 120C and 130C may respectively further include through vias 128A and 138A penetrating the second and third substrates 120 and 130 and upper wiring layers 128B and 138B arranged on the second surfaces of the second and third substrates 120 and 130 and connecting the through vias 128A and 138A to the main connection pads 136MP and 146MP.

A molding material 160 surrounding top surfaces and side surfaces of the first through fourth semiconductor chips 110C, 120C, 130C, and 140C may be further arranged, and connection bumps 170 may be attached to the main connection pads 116MP and the dummy connection pads 116DP arranged on the first surface of the first semiconductor chip 110C. The molding material 160 may include an epoxy mold compound (EMC) or the like, but in some embodiments, the molding material 160 may only cover the side surfaces of the first through fourth semiconductor chips 110C, 120C, 130C, and 140C or may be omitted.

In example embodiments, the first through fourth semiconductor chips 110C, 120C, 130C, and 140C may be memory chips or logic chips. For example, the first through fourth semiconductor chips 110C, 120C, 130C, and 140C may all be the same type of memory chip, and alternatively, at least one of the first through fourth semiconductor chips 110C, 120C, 130C, and 140C may be a logic chip and the rest of the first through fourth semiconductor chips 110C, 120C, 130C, and 140C may be memory chips.

Figure 13:
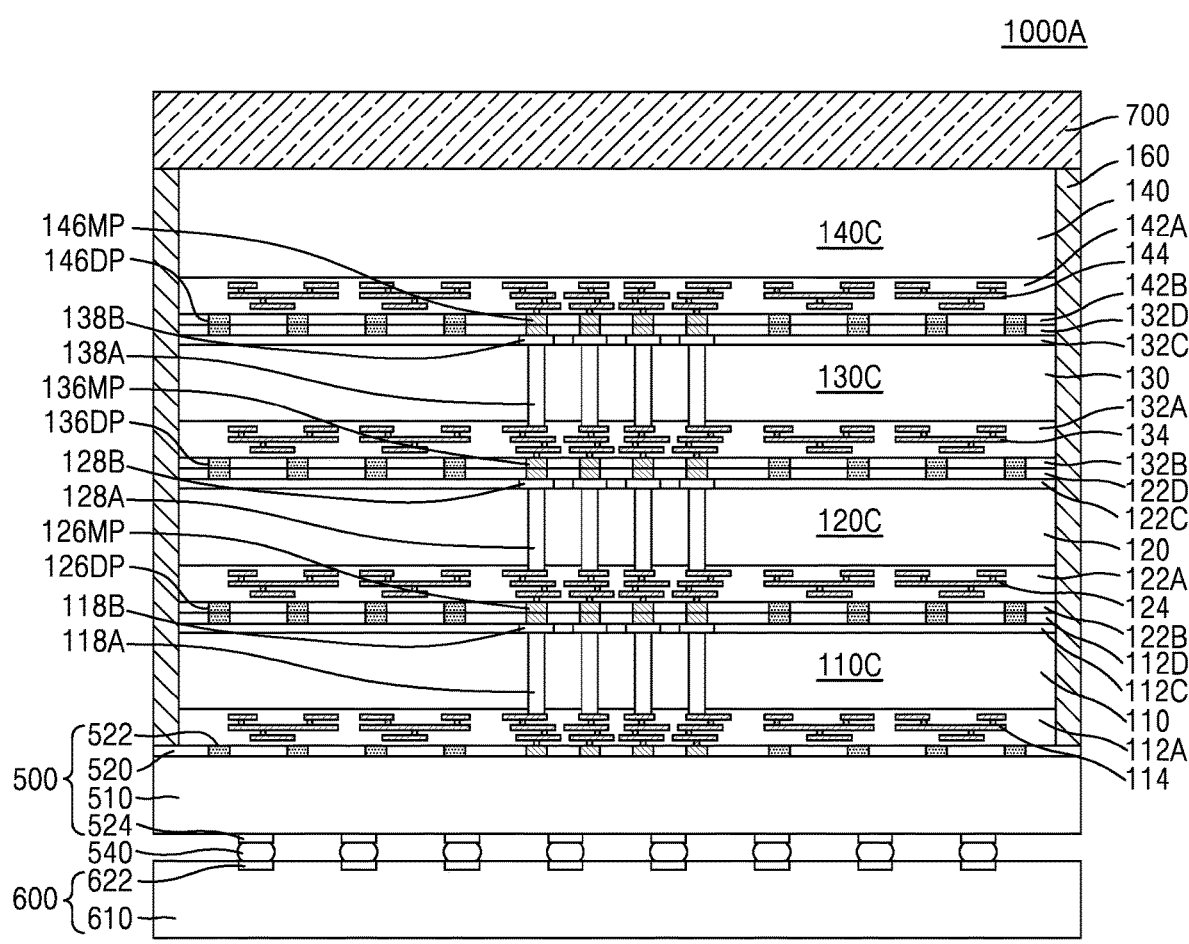
FIG. 13 is a cross-sectional diagram of a semiconductor package according to an example embodiment.

FIG. 13 is a cross-sectional diagram of a semiconductor package 1000A according to an example embodiment.

Referring to FIG. 13, the semiconductor package 1000A may further include an interposer 500. The interposer 500 may include a base layer 510, a redistribution layer 520, first top surface pads 522, and first bottom surface pads 524. A through via (not shown) electrically connecting each first top surface pad 522 to a first bottom surface pad 524 may be further arranged in the base layer 510. The interposer 500 and the first semiconductor chip 110C may be attached to each other through the metal-oxide hybrid bonding by using the first top surface pads 522. Alternatively, the interposer 500 and the first semiconductor chip 110C may be connected to each other through a connection bump (not shown).

A main board 600 may include a base board layer 610 and a second top surface pad 622, and the first bottom surface pad 524 of the interposer 500 may be electrically connected to the second top surface pad 622 of the main board 600 by a board connection terminal 540. A heat radiation unit 700 may be further arranged on the fourth semiconductor chip 140C.

Figure 14:
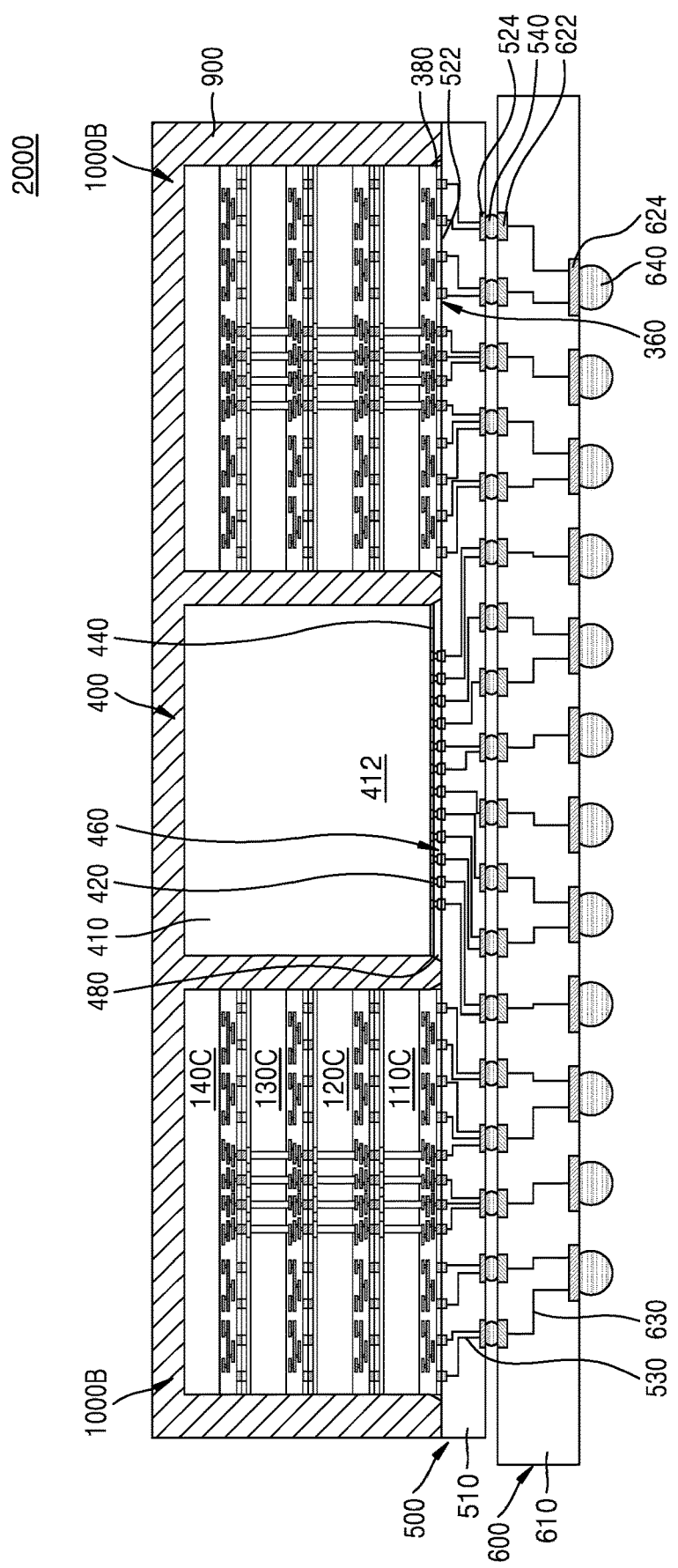
FIG. 14 is a cross-sectional diagram of a semiconductor package according to an example embodiment.

FIG. 14 is a cross-sectional diagram of a semiconductor package 2000 according to an example embodiment.

Referring to FIG. 14, the semiconductor package 2000 may include the main board 600 on which the interposer 500 is mounted, a sub-semiconductor package 1000B including the first through fourth semiconductor chips 110C, 120C, 130C, and 140C attached to the interposer 500, and a fifth semiconductor chip 400. A sub-semiconductor package 1000B may be the semiconductor package 1000 described with reference to FIG. 12. The semiconductor package 2000 may be referred to as a system.

Although FIG. 14 illustrates that the semiconductor package 2000 includes two sub-semiconductor packages 1000B, the inventive concept is not limited thereto. For example, the semiconductor package 2000 may include one sub-semiconductor package 1000B, or may include three or more sub-semiconductor packages 1000B.

The fifth semiconductor chip 400 may include a fifth substrate 410 on which a third semiconductor device 412 is formed on an active surface, a plurality of top surface connection pads 420, a front surface protective layer 440, and a plurality of connection bumps 460 attached on the plurality of top surface connection pads 420. The fifth semiconductor chip 400 may be, for example, a central processing unit (CPU) chip, a graphics processing unit (GPU) chip, or an application processor (AP) chip. Each of the plurality of top surface connection pads 420 may include at least one of aluminum, copper, and nickel.

The interposer 500 may include the base layer 510, the first top surface pad 522 and the first bottom surface pad 524 respectively arranged on the top surface and the bottom surface of the base layer 510, and a first wiring path 530 penetrating the base layer 510 and connecting the first top surface pad 522 to the first bottom surface pad 524.

The base layer 510 may include a semiconductor, glass, ceramic, or plastic. For example, the base layer 510 may include silicon. The first wiring path 530 may be a wiring layer connected to the first top surface pad 522 and/or the first bottom surface pad 524 on the top surface and/or the bottom surface of the base layer 510, or may be an inner through electrode electrically connecting the first top surface pad 522 to the first bottom surface pad 524 in the base layer 510. A connection bump 360 electrically connecting the sub-semiconductor package 1000B to the interposer 500 and a connection bump 460 electrically connecting the fifth semiconductor chip 400 to the interposer 500 may be connected to the first top surface pad 522.

A first underfill layer 380 may be between the sub-semiconductor package 1000B and the interposer 500, and a second underfill layer 480 may be between the fifth semiconductor chip 400 and the interposer 500. The first underfill layer 380 and the second underfill layer 480 may respectively surround the connection bump 360 and the connection bump 460.

The semiconductor package 2000 may further include, on the interposer 500, a package molding layer 900 surrounding the sub-semiconductor package 1000B and side surfaces of the fifth semiconductor chip 400. The package molding layer 900 may include, for example, an EMC. In some embodiments, the package molding layer 900 may cover the sub-semiconductor package 1000B and a top surface of the fifth semiconductor chip 400. In some other embodiments, the package molding layer 900 may not cover the top surface of the sub-semiconductor package 1000B and the fifth semiconductor chip 400. For example, a heat dissipation member may be attached on the sub-semiconductor package 1000B and the fifth semiconductor chip 400 with a thermal interface material (TIM) layer therebetween. The TIM layer may be, for example, mineral oil, grease, gap filler putty, phase-change gel, phase-change material pads, or particle filled epoxy. The heat dissipation member may be, for example, a heat sink, a heat spreader, a heat pipe, or a liquid cooled cold plate.

The board connection terminal 540 may be attached on the first bottom surface pad 524. The board connection terminal 540 may electrically connect the interposer 500 to the main board 600.

The main board 600 may include the base board layer 610, the second top surface pad 622 and a second bottom surface pad 624 respectively arranged on a top surface and a bottom surface of the base board layer 610, and a second wiring path 630 penetrating the base board layer 610 and connecting the second top surface pad 622 to the second bottom surface pad 624.

In some embodiments, the main board 600 may be a printed circuit board. For example, the main board 600 may be a multi-layer printed circuit board. The base board layer 610 may include at least one material selected from a phenol resin, an epoxy resin, and polyimide.

A solder resist layer (not shown) exposing the second top surface pad 622 and the second bottom surface pad 624 may be formed on each of the top surface and the lower surface of the base board layer 610. The board connection terminal 540 may be connected to the second top surface pad 622, and an external connection terminal 640 may be connected to the second bottom surface pad 624. The board connection terminal 540 may electrically connect the first bottom surface pad 524 to the second top surface pad 622. The external connection terminal 640 connected to the second bottom surface pad 624 may connect the semiconductor package 2000 to the outside.

In some embodiments, the semiconductor package 2000 may not include the main board 600, and the board connection terminal 540 of the interposer 500 may function as an external connection terminal.

The semiconductor packages described above include a package substrate (which may be a substrate of a first semiconductor chip of a stack of chips, or may be an interposer or main board), a plurality of semiconductor chips stacked on the package substrate, and an encapsulation material, which may be a mold layer and may include a heat radiation unit. A semiconductor package may generally be described as a semiconductor device.

FIGS. 15 to 24 are schematic diagrams illustrating a method of manufacturing a semiconductor package according to example embodiments. FIGS. 15 to 24 illustrate a method of manufacturing the semiconductor package 1000 described with reference to FIG. 12 according to an operation sequence, and FIGS. 16 to 24 are cross-sectional views taken along line A3-A3' of FIG. 15.

Figure 15:
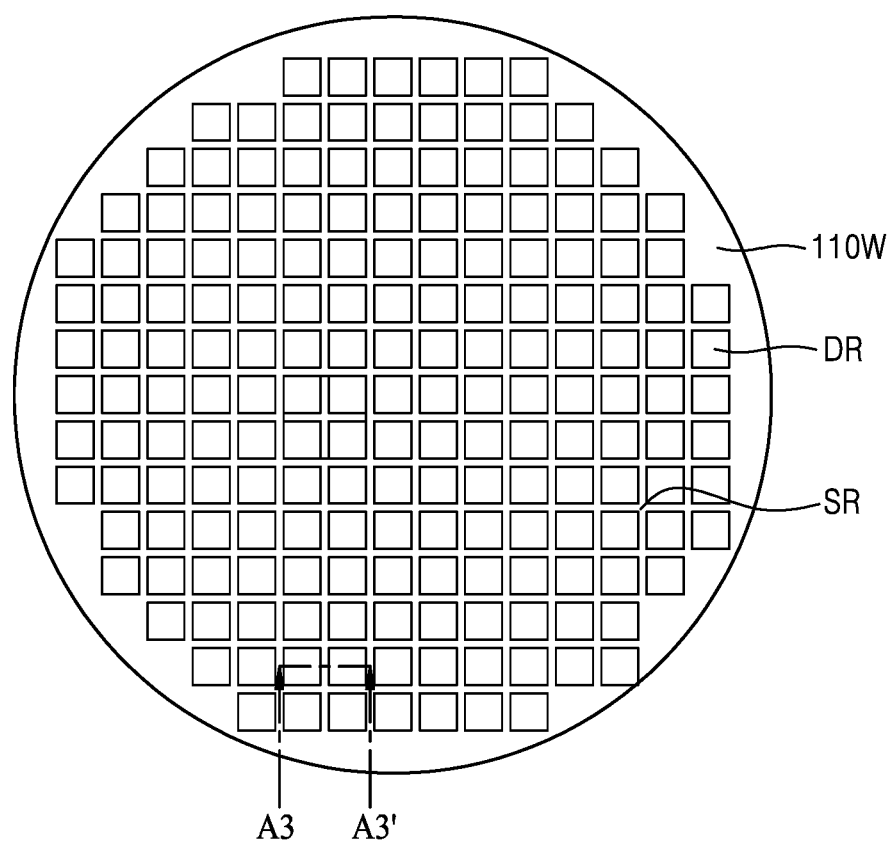
FIGS. 15 to 24 are schematic diagrams illustrating a method of manufacturing a semiconductor package according to example embodiments.
Figure 16:
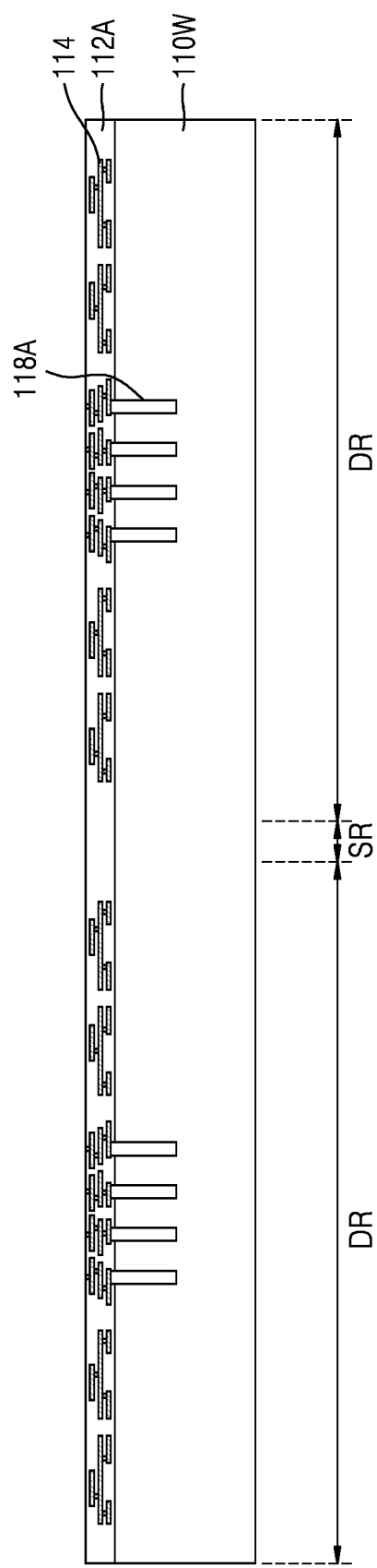

Referring to FIGS. 15 and 16, a first wafer 110W including a plurality of device regions DR is provided. The plurality of device regions DR may be arranged to be spaced apart from each other by a scribe lane region SR. The wiring layer 114 and the interlayer insulating film 112A may be formed on the first wafer 110W. In addition, the through vias 118A may be further formed in the first wafer 110W.

Figure 17:
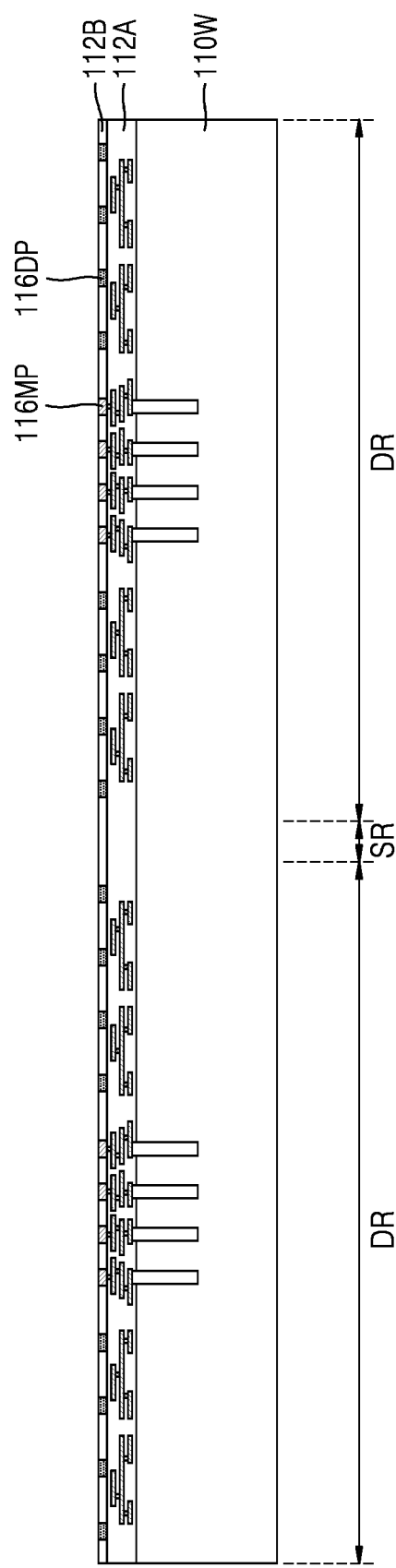

Referring to FIG. 17, the main connection pads 116MP and the dummy connection pad 116DP are formed by forming the bonding insulating layer 112B on the interlayer insulating film 112A and the bonding insulating layer 112B, etching a portion of the bonding insulating layer 112B to form an opening (not shown), and filling the opening with a conductive material such as a metal material. The main connection pads 116MP and the dummy connection pads 116DP may be formed in a manner similar to that of the first connection pads 16 described with reference to FIGS. 4 and 5. The bonding insulating layer 112B may initially be thicker than shown in FIG. 17, and the metal material may fill the holes in the bonding insulating layer 112B. Subsequently, a planarization step may occur, in which part of the metal material and part of the initial bonding insulating layer 112B are planarized and removed to result in the thinner layer shown in FIG. 17. During this process, because of the layout of the main and dummy connection pads 116MP and 116DP (e.g., arranged according to one of the example embodiments discussed in connection with FIGS. 1-11), local erosion of the bonding insulating layer may be prevented or reduced.

Figure 18:
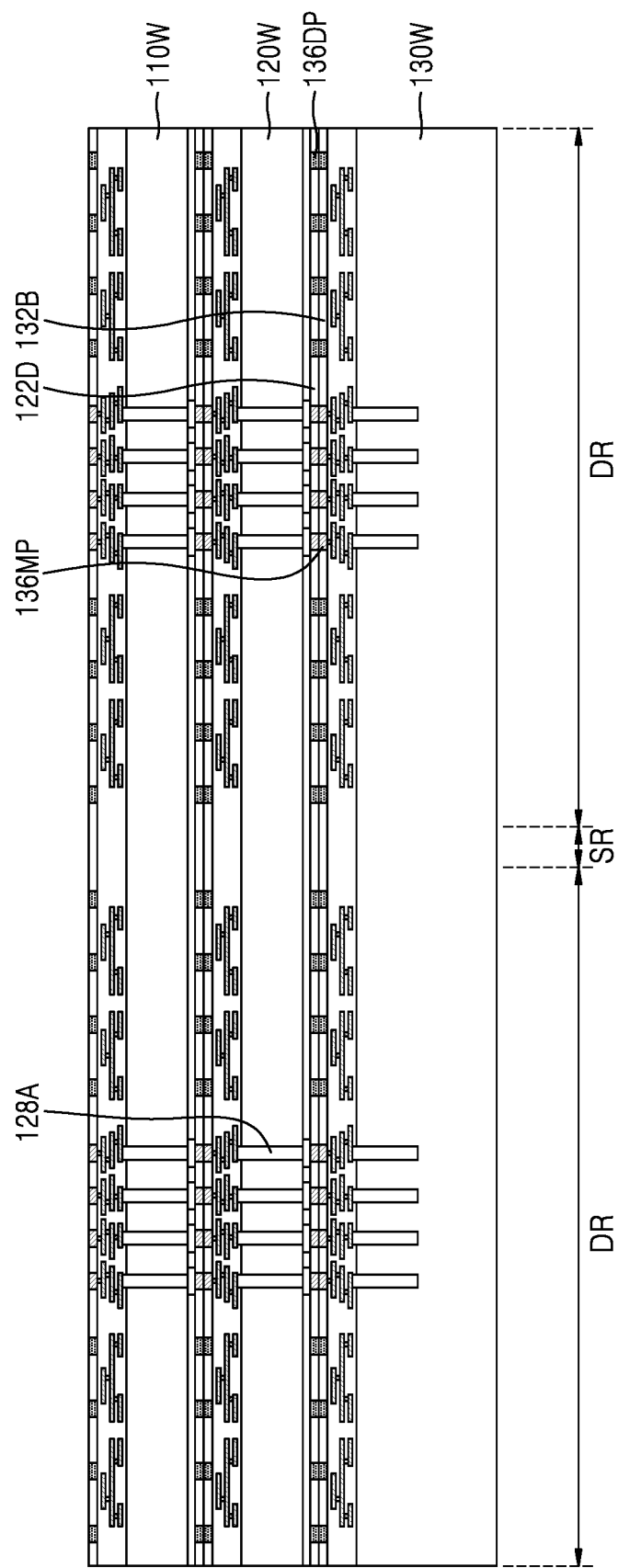

Referring to FIG. 18, a second wafer 120W, a third wafer 130W, and a fourth wafer (not shown) may be prepared by performing an operation described with respect to the first wafer 110W.

Then, the second wafer 120W may be attached on the third wafer 130W, and in addition, the first wafer 110W may be attached on the second wafer 120W. In example embodiments, in an operation of attaching the second wafer 120W on the third wafer 130W, a high-temperature heat treatment may be applied in a state in which connection pads (not shown) and a bonding insulating layer 122D on the second wafer 120W are in contact with connection pads (not shown) and a bonding insulating layer 132B on the third wafer 130W.

Thereafter, a portion of a thickness of the second wafer 120W may be removed by performing a grinding operation to expose a through via 128A. Although FIG. 18 illustrates an example in which an active surface (or a front surface) of the third wafer 130W is attached to an inactive surface (or a rear surface) of the second wafer 120W, alternatively, the active surface of the third wafer 130W may be attached to an active surface of the second wafer 120W. In this case, the second wafer 120W and the third wafer 130W may be bonded in a face-to-face method.

Figure 19:
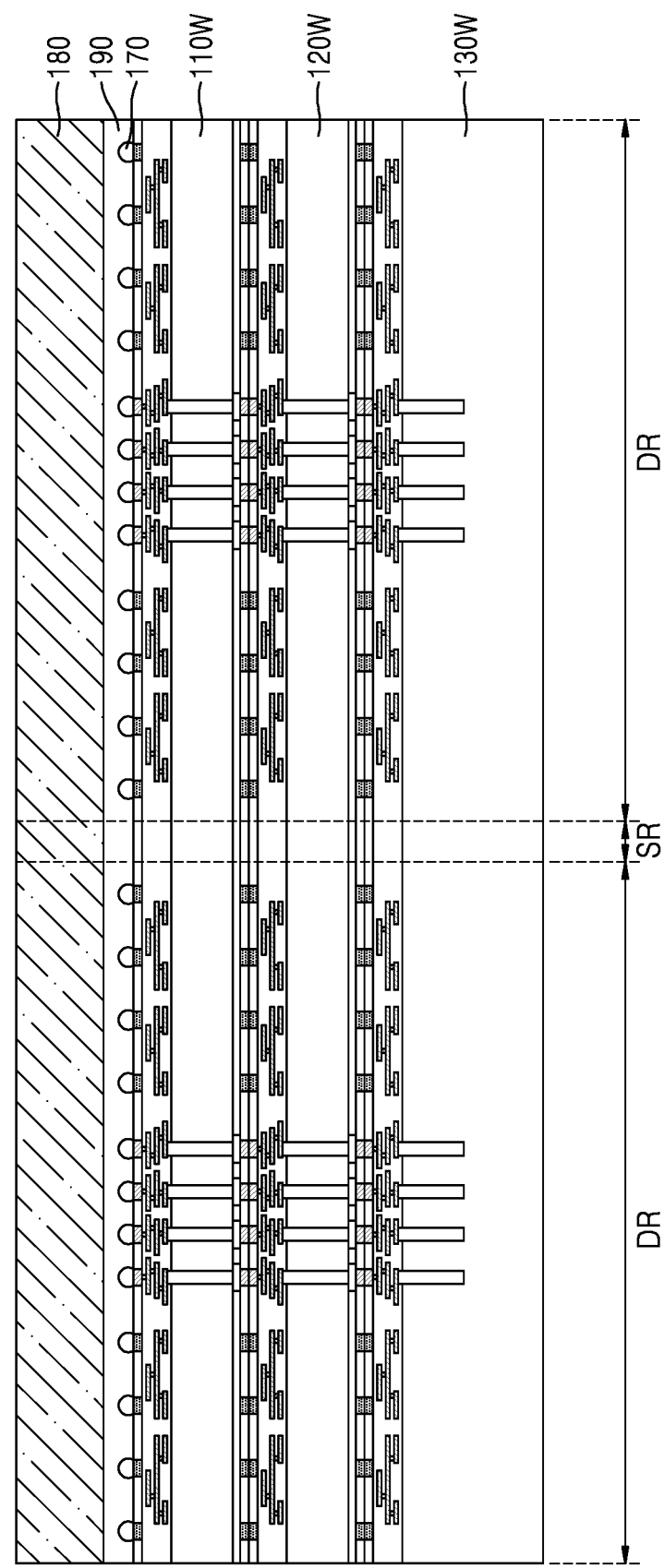

Referring to FIG. 19, the connection bumps 170 may be attached on a front surface of the first wafer 110W. Then, a carrier substrate 180 may be attached on the connection bumps 170. An adhesive layer 190 may be formed between the first wafer 110W and the carrier substrate 180.

In example embodiments, a case where the carrier substrate 180 is used is illustrated, but in other embodiments, the carrier substrate 180 or a wafer support system (WSS) may be omitted.

Figure 20:
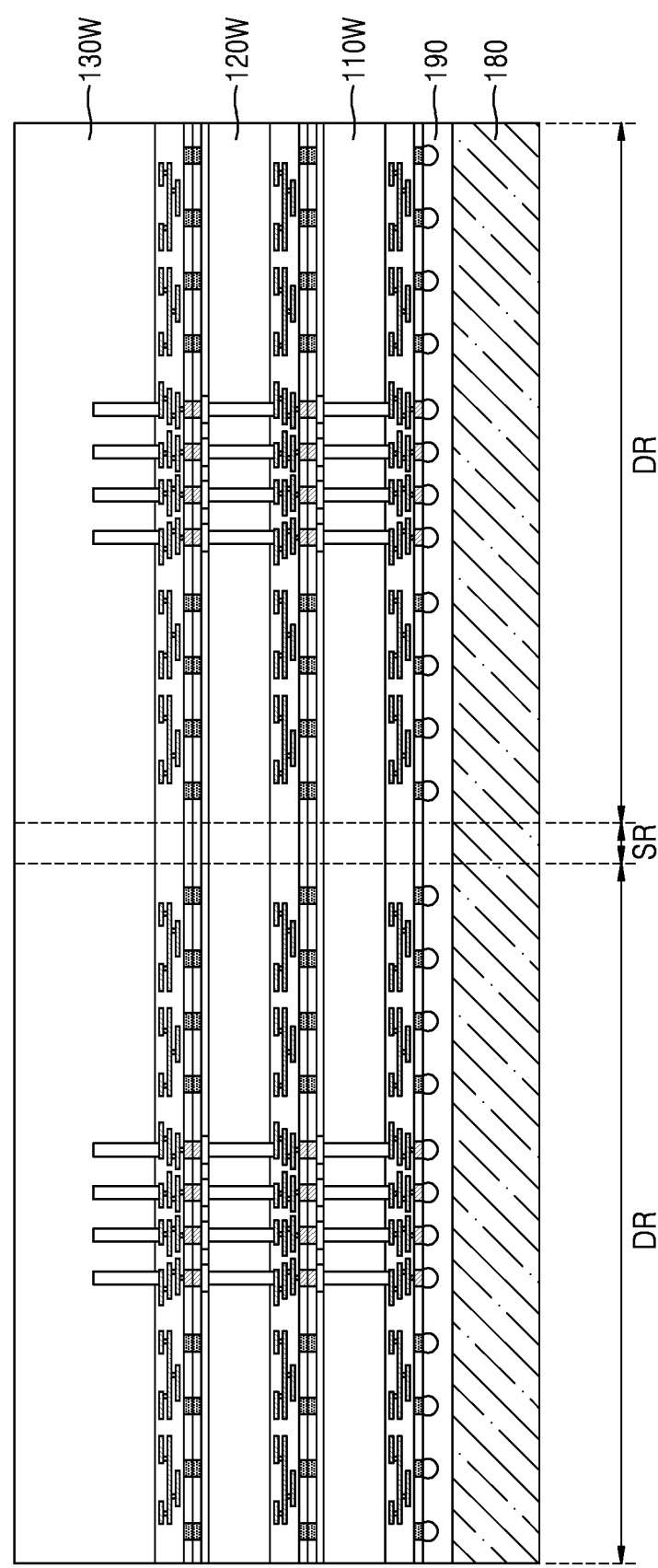

Referring to FIG. 20, a structure to which the first through third wafers 110W, 120W, and 130W are bonded may be reversed (e.g., flipped).

Figure 21:
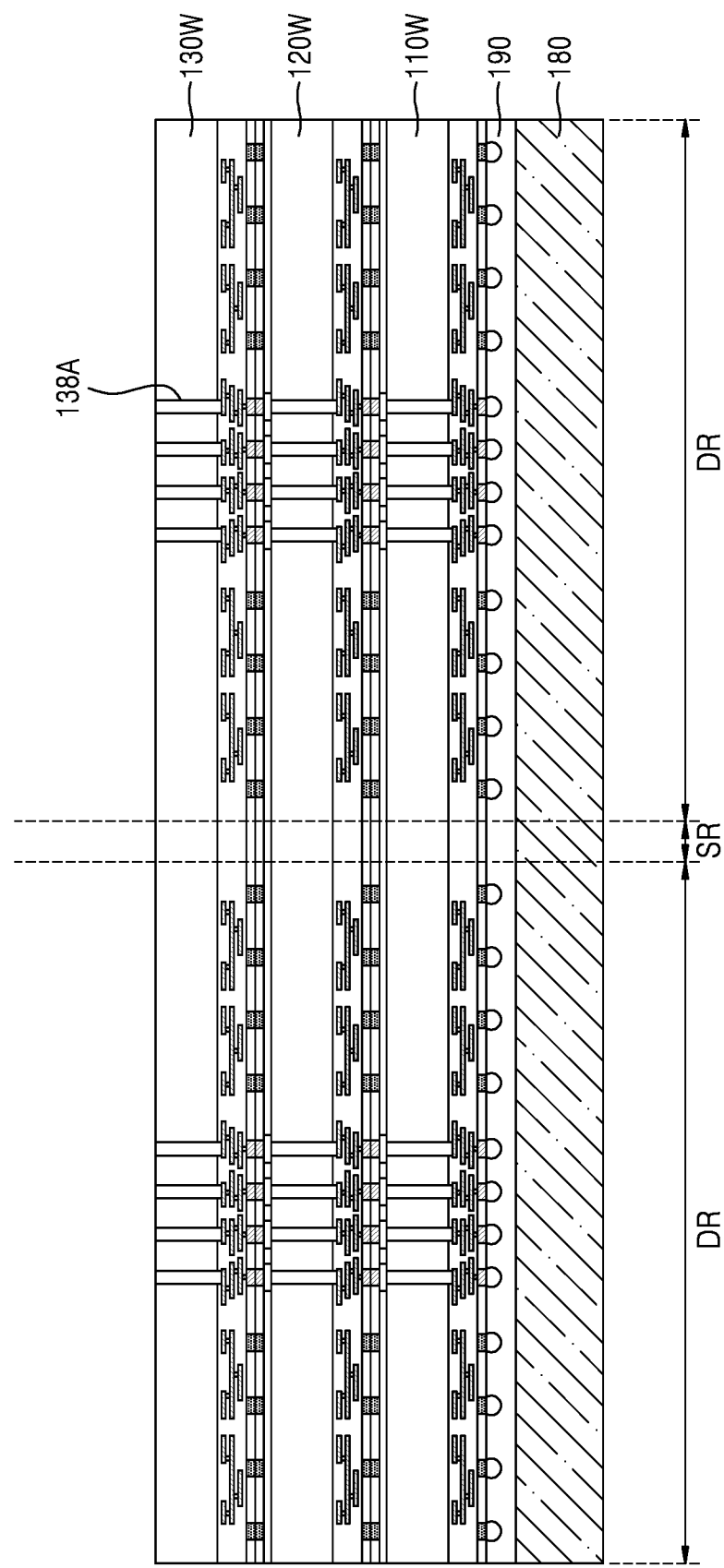

Referring to FIG. 21, a through via 138A may be exposed by removing a portion of a thickness of the third wafer 130W by performing a grinding operation.

Figure 22:
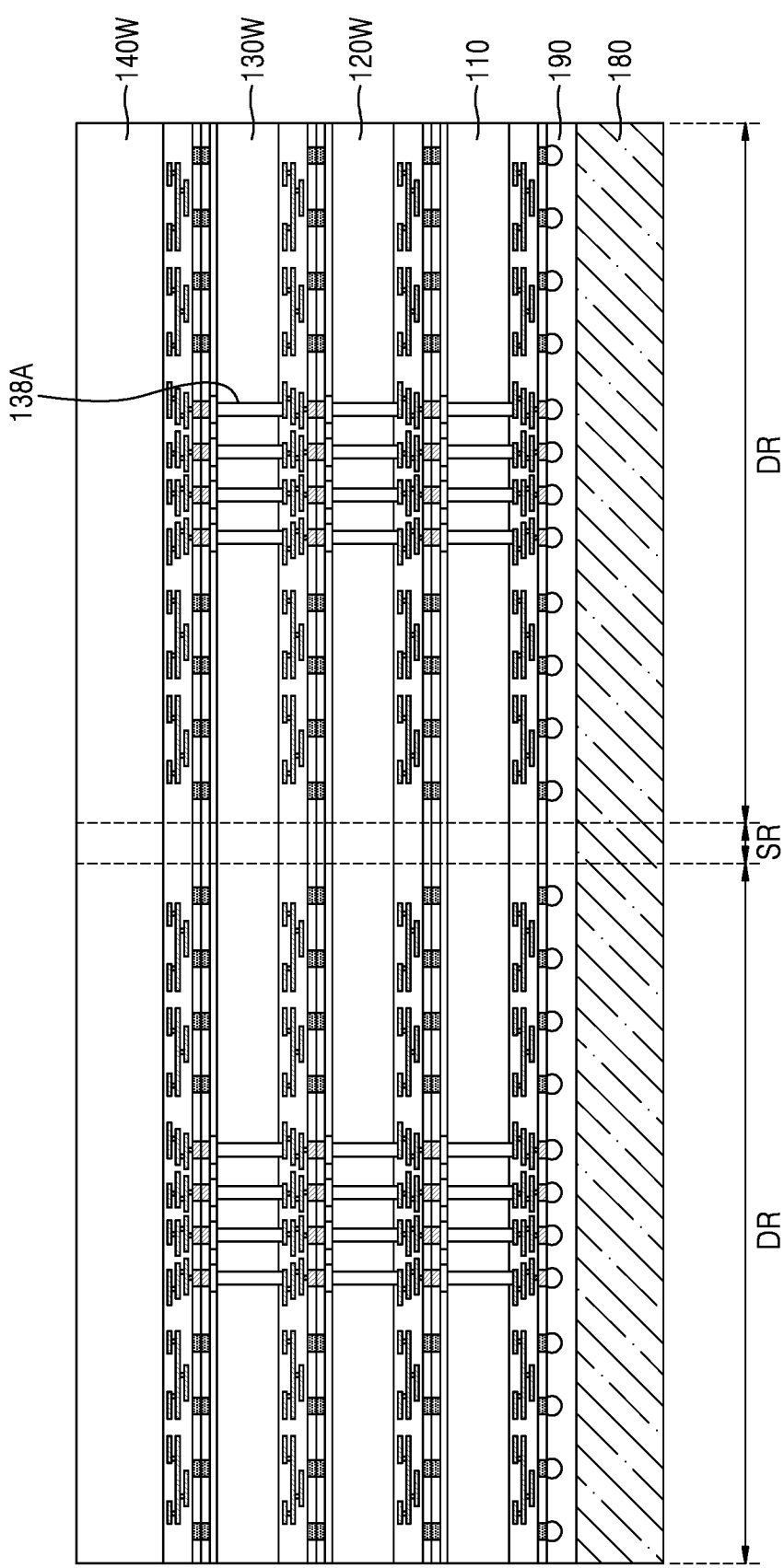

Referring to FIG. 22, the fourth wafer 140W may be attached on the third wafer 130W. The fourth wafer 140W may be a wafer which does not include through vias. Then, a portion of a thickness of the fourth wafer 140W may be removed by performing a grinding operation.

Figure 23:
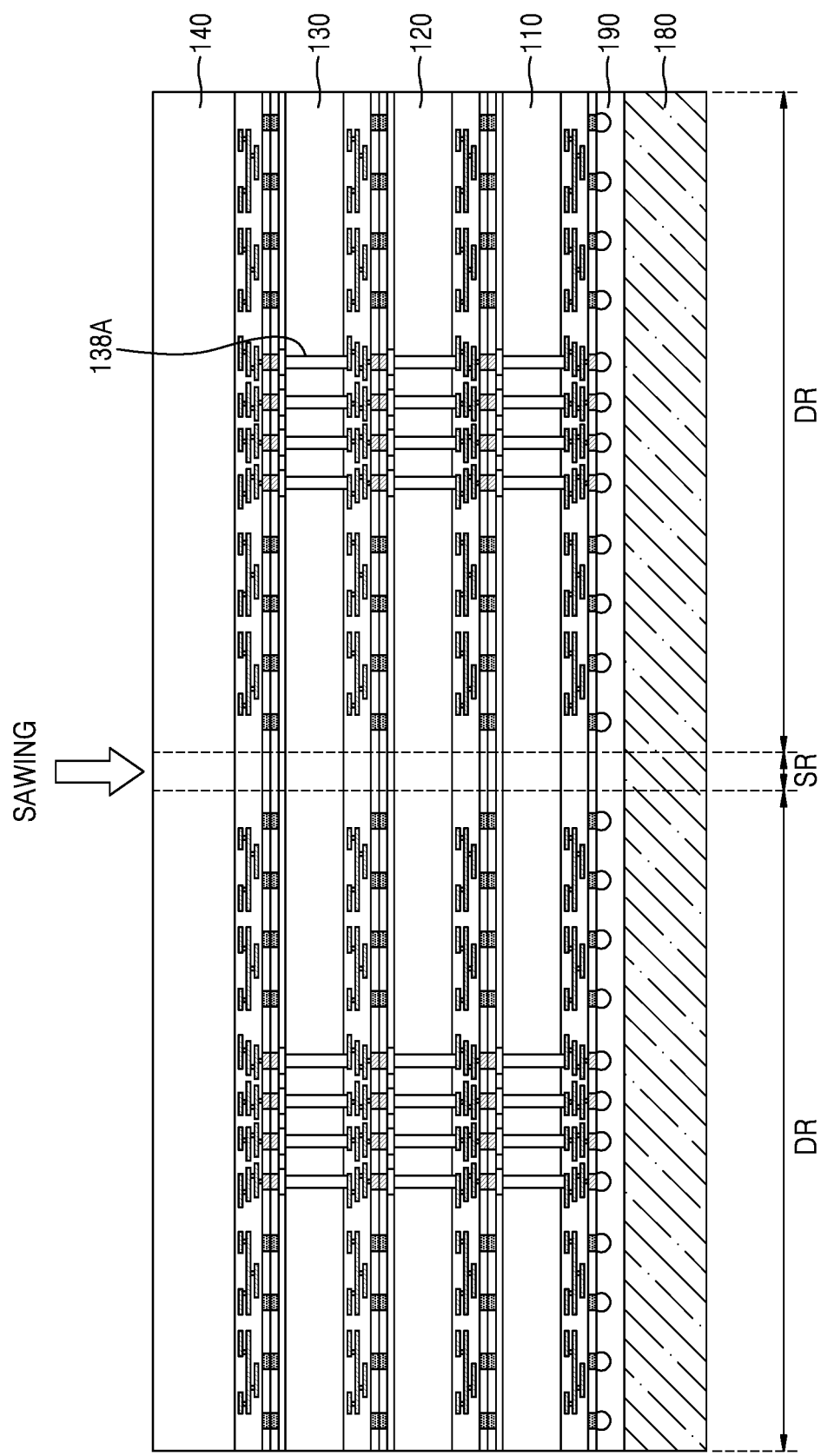

Referring to FIG. 23, a stack structure of the first through fourth wafers 110W, 120W, 130W, and 140W may be sawed according to the scribe lane region SR to be separated into a plurality of structures in which the first through fourth substrates 110, 120, 130, and 140 are stacked.

Figure 24:
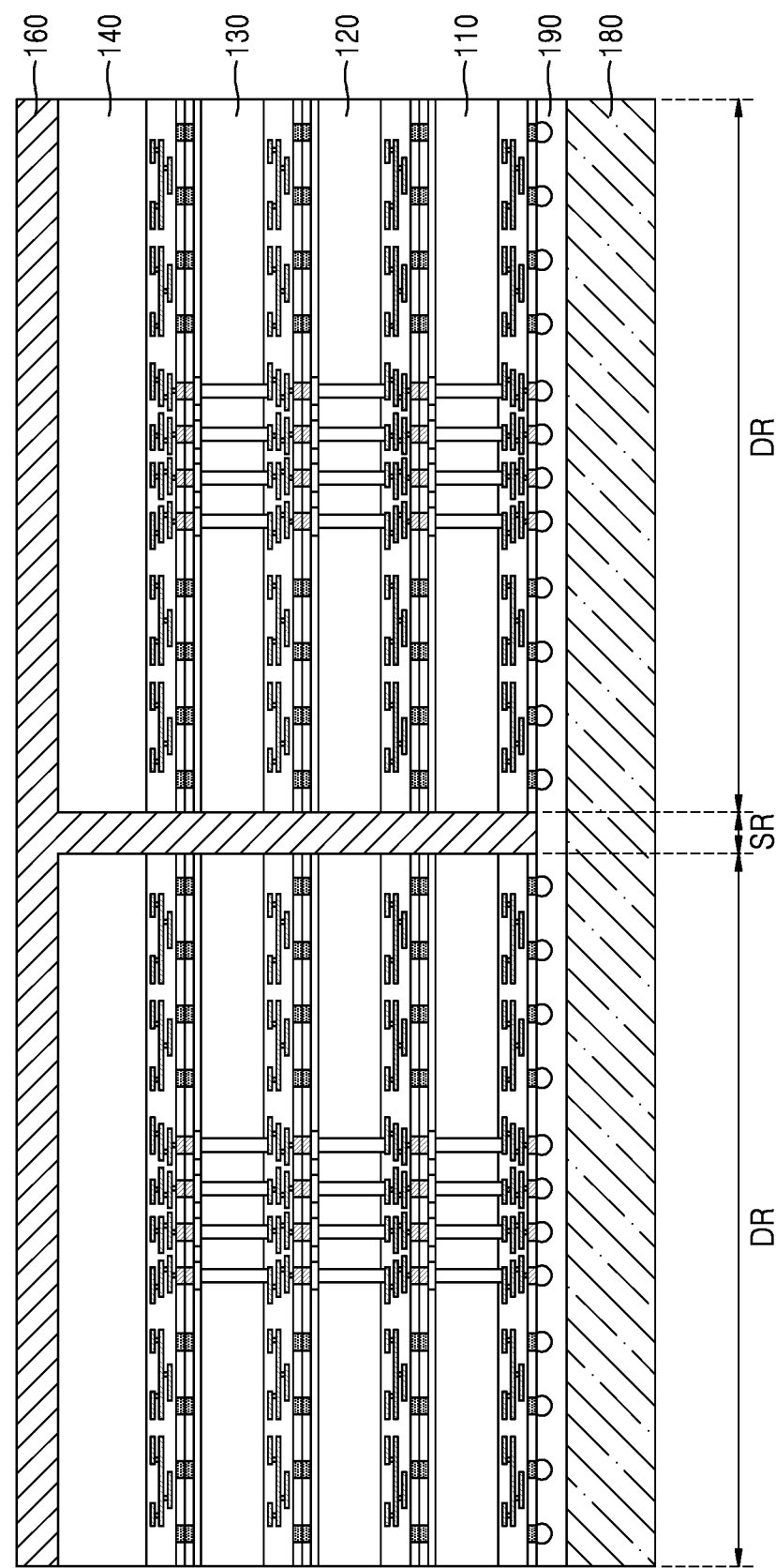

Referring to FIG. 24, the molding material 160 covering side surfaces and a top surface of a plurality of structures in which the first through fourth substrates 110, 120, 130, and 140 are stacked may be formed.

Thereafter, as the carrier substrate 180 is removed and each structure is singulated, the semiconductor package 1000 (refer to FIG. 12) may be completed.

FIGS. 22 and 23 illustrate an example in which the molding material 160 is formed after performing the grinding operation of the fourth wafer 140W, but in other embodiments, the molding material 160 may be also formed before performing the grinding operation of the fourth wafer 140W, and then the grinding operation of the fourth wafer 140W may be performed.

While the inventive concept has been particularly shown and described with reference to embodiments thereof, it will be understood that various changes in form and details may be made therein without departing from the spirit and scope of the following claims.

What is claimed is:

1. A semiconductor package comprising:
 a first semiconductor chip;
 a second semiconductor chip;
 first main connection pad structures arranged at an interface between the first semiconductor chip and the second semiconductor chip and arranged to be apart from each other by a first main pitch in a first direction parallel to a top surface of the first semiconductor chip, wherein each of the first main connection pad structures comprises a first connection pad electrically connected to the first semiconductor chip, and a second connection pad electrically connected to the second semiconductor chip and contacting the first connection pad;

first dummy connection pad structures arranged at the interface between the first semiconductor chip and the second semiconductor chip, arranged to be apart from the first main connection pad structures, and arranged to be apart from each other by a first dummy pitch in the first direction, the first dummy pitch being greater than the first main pitch;

second dummy connection pad structures arranged at the interface between the first semiconductor chip and the second semiconductor chip and arranged to be apart from each other by a second dummy pitch in the first direction; and third dummy connection pad structures arranged at the interface between the first semiconductor chip and the second semiconductor chip and arranged to be apart from each other by a third dummy pitch in the first direction, wherein the second dummy pitch is greater than the first dummy pitch, and the third dummy pitch is greater than the second dummy pitch.

2. The semiconductor package of claim 1, further comprising:

a first bonding insulating layer arranged on the first semiconductor chip and arranged to have a surface coplanar with a surface of each first connection pad at the interface between the first semiconductor chip and the second semiconductor chip; and a second bonding insulating layer arranged on the second semiconductor chip, arranged to have a surface coplanar with a surface of each second connection pad at the interface between the first semiconductor chip and the second semiconductor chip, and contacting the first bonding insulating layer.

3. The semiconductor package of claim 1, further comprising a molding material surrounding side surfaces of the first semiconductor chip and side surfaces of the second semiconductor chip, wherein, when viewed from the top of the first semiconductor chip, the first dummy connection pad structures surround the first main connection pad structures.

4. The semiconductor package of claim 1, wherein the first main connection pad structures, the first dummy connection pad structures, the second dummy connection pad structures, and the third dummy connection pad structures are arranged in order in the first direction from a center region of the semiconductor package toward an edge of the semiconductor package such that the first main connection pad structures are at the center region of the semiconductor package, and the third dummy connection pad structures are closest to the edge of the semiconductor package among the first main connection pad structures, the first dummy connection pad structures, the second dummy connection pad structures, and the third dummy connection pad structures.

5. The semiconductor package of claim 1, wherein the first main connection pad structures have a first main pad density when viewed from the top of the first semiconductor chip, the first dummy connection pad structures have a first dummy pad density when viewed from the top of the first semiconductor chip, the second dummy connection pad structures have a second dummy pad density when viewed from the top of the first semiconductor chip, and the third dummy connection pad structures have a third dummy pad density when viewed from the top of the first semiconductor chip, and wherein the first dummy pad density is less than the first main pad density, the second dummy pad density is less than the first dummy pad density, and the third dummy pad density is less than the second dummy pad density.

6. The semiconductor package of claim 1, wherein:

the first main connection pad structures are arranged in a first main pad region, the first main connection pad structures have a first main pad density when viewed from the top of the first semiconductor chip, the first dummy connection pad structures are arranged in a first dummy pad region, and the first dummy pad region comprises n sub-dummy pad regions, and n is determined by Equation 1, $$(D\_MP1)/(DCR)-1 \leq n < (D\_MP1)/(DCR):$$ Equation 1, wherein n is a natural number, DCR is a reference pad density, and a k-th sub-dummy pad region has a sub-dummy pad density according to Equation 2, $$D\_DPk=(n+1-k)/(n+1)*D\_MP1:$$ Equation 2, wherein D_DPk is a density of the k-th sub-dummy pad region, k is a natural number from 1 to n, and D_MP1 is the first main pad density.

7. A semiconductor package, comprising:

a first semiconductor chip;

a second semiconductor chip;

first main connection pad structures arranged at an interface between the first semiconductor chip and the second semiconductor chip and arranged to be apart from each other by a first main pitch in a first direction parallel to a top surface of the first semiconductor chip, wherein each of the first main connection pad structures comprises a first connection pad electrically connected to the first semiconductor chip, and a second connection pad electrically connected to the second semiconductor chip and contacting the first connection pad;

first dummy connection pad structures arranged at the interface between the first semiconductor chip and the second semiconductor chip, arranged to be apart from the first main connection pad structures, and arranged to be apart from each other by a first dummy pitch in the first direction, the first dummy pitch being greater than the first main pitch; and second main connection pad structures arranged at the interface between the first semiconductor chip and the second semiconductor chip, arranged to be apart from the first main connection pad structures and the first dummy connection pad structures, and arranged to be apart from each other by a second main pitch in the first direction, the second main pitch being greater than the first main pitch.

8. The semiconductor package of claim 7, wherein:

the first main connection pad structures are arranged in a first main pad region, the first main connection pad structures have a first main pad density when viewed from the top of the first semiconductor chip, the second main connection pad structures are arranged in a second main pad region, the second main connection pad structures have a second main pad density when viewed from the top of the first semiconductor chip, the first dummy connection pad structures are arranged in a first dummy pad region, and the first dummy connection pad structures have a first dummy pad density when viewed from the top of the first semiconductor chip, a difference between the first main pad density and the second main pad density is less than a reference pad density, and the first dummy pad density is determined by Equations 3 to 5, $$D\_DP1 = k1 * D\_MP1 + k2 * D\_MP2: \quad \text{Equation 3,}$$

$$k1 = A\_MP1 / (A\_MP1 + A\_MP2 + A\_DP1): \quad \text{Equation 4,}$$

$$k2 = A\_MP2 / (A\_MP1 + A\_MP2 + A\_DP1): \quad \text{Equation 5,}$$

wherein D_DP1 is the first dummy pad density, D_MP1 is the first main pad density, D_MP2 is the second main pad density, A_DP1 is an area of the first dummy pad region, A_MP1 is an area of the first main pad region, and A_MP2 is an area of the second main pad region.

9. The semiconductor package of claim 8, wherein the reference pad density is about 2% to about 5%.

10. The semiconductor package of claim 8, wherein the first dummy pad density is less than the first main pad density, and the second main pad density is less than the first dummy pad density.

11. The semiconductor package of claim 8, wherein the first dummy pad density is less than the first main pad density, and the first dummy pad density is less than the second main pad density.

12. The semiconductor package of claim 7, wherein:

the first main connection pad structures are arranged in a first main pad region, the first main connection pad structures have a first main pad density when viewed from the top of the first semiconductor chip, the second main connection pad structures are arranged in a second main pad region, the second main connection pad structures have a second main pad density when viewed from the top of the first semiconductor chip, a difference between the first main pad density and the second main pad density is greater than a reference pad density, the first dummy connection pad structures are arranged in a first dummy pad region, the first dummy pad region comprises n sub-dummy pad regions, n is determined by Equation 6, $$(D\_MP1 - D\_MP2)/(DCR) - 1 \leq n < (D\_MP1 - D\_MP2)/(DCR): \quad \text{Equation 6,}$$

wherein n is a natural number, DCR is the reference pad density, and a k-th sub-dummy pad region has a sub-dummy pad density according to Equation 7, $$D\_DPk = (n+1-k)/(n+1) * D\_MP1 + (k)/(n+1) * D\_MP2: \quad \text{Equation 7,}$$

wherein D_DPk is a density of the k-th sub-dummy pad region, k is a natural number from 1 to n, D_MP1 is the first main pad density, and D_MP2 is the second main pad density.

* * * * *